(12) United States Patent
Takakuwa et al.

(10) Patent No.: US 7,709,162 B2
(45) Date of Patent: May 4, 2010

(54) PHOTOSENSITIVE COMPOSITION, COLOR FILTER, AND ITS PRODUCTION METHOD

(75) Inventors: Hideki Takakuwa, Shizuoka-ken (JP); Katsumi Araki, Shizuoka-ken (JP); Yuki Mizukawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1057 days.

(21) Appl. No.: 11/401,855

(22) Filed: Apr. 12, 2006

(65) Prior Publication Data

US 2006/0251976 A1 Nov. 9, 2006

(30) Foreign Application Priority Data

Apr. 12, 2005 (JP) ............................. 2005-114894
Aug. 31, 2005 (JP) ............................. 2005-252023

(51) Int. Cl.
*G02B 5/20* (2006.01)
*G03F 7/004* (2006.01)

(52) U.S. Cl. ....................................... 430/7; 430/270.1

(58) Field of Classification Search ....................... None
See application file for complete search history.

(56) References Cited

U.S. PATENT DOCUMENTS

| | | | |
|---|---|---|---|
| 3,966,706 A | 6/1976 | Ramanathan | |
| 4,213,898 A | 7/1980 | Entschel et al. | |
| 4,247,456 A | 1/1981 | Von Brachel et al. | |
| 4,329,283 A | 5/1982 | Reel et al. | |
| 4,330,468 A | 5/1982 | Brierley et al. | |
| 4,933,426 A | 6/1990 | McClelland et al. | |
| 5,102,448 A | 4/1992 | Parton et al. | |
| 6,533,852 B2 | 3/2003 | Hirose | |
| 6,632,858 B1 | 10/2003 | Pears et al. | |
| 6,713,227 B2 | 3/2004 | Machiguchi et al. | |
| 6,987,174 B2 | 1/2006 | Araki | |
| 7,193,068 B2 | 3/2007 | Araki et al. | |
| 2005/0043452 A1* | 2/2005 | Araki | 524/190 |
| 2005/0064307 A1 | 3/2005 | Fujimori | |
| 2006/0251976 A1 | 11/2006 | Takakuwa et al. | |
| 2006/0293405 A1* | 12/2006 | Araki et al. | 522/75 |
| 2007/0049650 A1 | 3/2007 | Araki | |
| 2007/0117031 A1 | 5/2007 | Mizukawa et al. | |
| 2007/0254240 A1 | 11/2007 | Sasaki et al. | |
| 2009/0049624 A1 | 2/2009 | Aizawa et al. | |

FOREIGN PATENT DOCUMENTS

| | | |
|---|---|---|
| DE | 2714204 | 10/1977 |
| FR | 2303839 | 3/1976 |
| GB | 1460824 | 1/1977 |
| GB | 1537365 | 12/1978 |
| JP | 54-70337 | 6/1979 |
| JP | 54-70337 A | 6/1979 |
| JP | 58-152240 | 9/1983 |
| JP | 60-112862 | 6/1985 |
| JP | 60-112862 A | 6/1985 |
| JP | 2-199403 A | 8/1990 |
| JP | 4-76062 A | 3/1992 |
| JP | 5-273411 A | 10/1993 |
| JP | 6-75375 A | 3/1994 |
| JP | 6-184482 A | 7/1994 |
| JP | 7-140654 A | 6/1995 |
| JP | 2002-14221 | 1/2002 |
| JP | 2002-278056 | 9/2002 |
| JP | 2003-149801 A | 5/2003 |
| PL | 101484 | 2/1977 |

* cited by examiner

*Primary Examiner*—John A. McPherson
(74) *Attorney, Agent, or Firm*—Sughrue Mion, PLLC

(57) ABSTRACT

A photosensitive composition containing at least an organic-solvent-soluble dye, wherein the solid content of the organic-solvent-soluble dye is 50% by weight or higher based on the total weight of the solid content of the photosensitive composition, and the organic-solvent-soluble dye comprises at least one di- or higher-valent metal salt of an azo dye.

11 Claims, No Drawings

PHOTOSENSITIVE COMPOSITION, COLOR FILTER, AND ITS PRODUCTION METHOD

CROSS-REFERENCE TO RELATED APPLICATION

This application claims priority under 35 USC 119 from Japanese patent Application Nos. 2005-114894 and 2005-252023, the disclosures of which are incorporated by reference herein.

BACKGROUND OF THE INVENTION

1. Field of the Invention

The present invention relates to a photosensitive composition useful for forming a color filter to be used a liquid crystal display device and a solid-state imaging device, a dye-containing color filter, and its production method.

2. Description of the Related Art

As a method of producing a color filter to be used for a liquid crystal display device (LCD) and a solid-state imaging device (CCD, CMOS) have been known a dyeing method, a printing method, an electrodeposition method and a pigment dispersion method.

The pigment dispersion method among them is a method of producing a color filter by photolithography using a colored radiation sensitive composition obtained by dispersing various kinds of pigments in a photosensitive composition and since pigments are used, it is advantageous in the stability to light and heat. Also, since patterning is carried out by the photolithographic method, the method has a high positioning precision and been therefore used widely and preferably for producing a color filter for a large screen and highly fine color display.

In the case of producing a color filter by the pigment dispersion method, a radiation-sensitive composition is applied to a glass substrate by a spin coater or a roll coater and dried to form a film and then the film is pattern-wise exposed and developed to form colored pixels and these steps are repeated for respective colors corresponding to a desired number of hues to obtain a color filter. As such a pigment dispersion method is reported an example using a negative type photosensitive composition containing an alkali-soluble resin in combination with a photo-polymerizable monomer and a photopolymerization initiator (e.g. reference to Japanese Patent Laid-Open (JP-A) No. 2-199403).

On the other hand, in these years, it has been desired to make a color filter for a solid-state imaging device finer. However, in a conventional pigment dispersion system, since ultraviolet rays are scattered at the time of exposure, it is difficult to further improve the resolution and a problem of occurrence of color unevenness attributed to coarse particles of a pigment takes place and accordingly it is not suitable for applications for which fine patterns are required just like the solid-state imaging device.

In consideration of the above-mentioned problems, techniques of using dyes in place of pigments have been proposed before (e.g., reference to JP-A No. 6-75375).

Further, in these years, in the case of producing a color filter for a solid-state imaging device, it has also been required to make the filter thinner. To simultaneously satisfy both requirements of sufficient coloring density and thinness, a large quantity of a coloring agent has to be added to a photosensitive composition and contents of other materials have to be decreased. Even if a composition satisfying that is produced, no significant problem is caused in the case of using a pigment for the coloring agent (e.g. reference to JP-A No. 2003-149801).

SUMMARY OF THE INVENTION

However, when a composition is to be produced as described above, in the case an organic-solvent-soluble dye is to be used as the coloring agent, there occurs a problem that the organic solvent resistance of the colored pattern becomes insufficient and when a previously formed colored pattern is overlaid with a next color, the dye in the previously formed colored pattern is eluted. The problem becomes particularly significant when the dye concentration is high.

In view of the above state of the art, the invention provides a photosensitive composition, a color filter, and its production method.

In the present invention, it is found that in a composition containing a large quantity of organic-solvent-soluble dye as a coloring agent and decreased amounts of other materials, if an azo dye which is a salt of di- or higher-valent metal is used as the organic-solvent-soluble dye, the elution of a dye from a previously formed pattern is particularly effectively prevented when the previously formed pattern is once cured and then overlaid with another colored pattern by applying a composition for the latter colored pattern. Based on the finding, the invention has been accomplished.

A first aspect of the invention provides a photosensitive composition containing at least an organic-solvent-soluble dye, wherein the solid content of the organic-solvent-soluble dye is 50% by weight or higher in the total solid content and the organic-solvent-soluble dye includes at least one di- or higher-valent metal salt of an azo dye (hereinafter, sometimes referred to as an azo organic-solvent-soluble dye).

A second aspect of the invention provides a color filter containing at least an organic-solvent-soluble dye in an amount of 50% by weight or higher in the total solid content, wherein the organic-solvent-soluble dye includes at least one di- or higher-valent metal salt of an azo dye.

A third aspect of the invention provides a production method of the color filter, the method including applying the above-mentioned photosensitive composition on a support, exposing the composition through a mask, and developing the resulting composition to form a patterned image.

DESCRIPTION OF THE PRESENT INVENTION

Hereinafter, a photosensitive composition, a color filter using the composition, and its production method according to the invention will be described specifically.

Photosensitive Composition

A photosensitive composition according to the invention contains at least a di- or higher-valent metal salt of an azo organic-solvent-soluble dye and preferably further contains a radiation sensitive compound, a curing agent, and an alkali-soluble resin. The photosensitive composition according to the invention is generally produced by using a solvent and, if necessary, various additives.

—Di- or Higher-Valent Metal Salt of an Azo Organic-Solvent-Soluble Dye—

The photosensitive composition according to the invention contains, as a dye, at least one di- or higher-valent metal salt of an azo organic-solvent-soluble dye (hereinafter, sometimes referred to as an azo dye metal salt according to the invention). The azo dye metal salt according to the invention is not particularly limited except that it is soluble in an organic solvent and dyes conventionally known, and used for color filters can be used.

In the invention, the photosensitive composition contains the organic-solvent-soluble dye in an amount of 50% by weight or higher based on the total solid content of the photosensitive composition. If the dye concentration is 50% by weight or higher in the total solid content, the organic solvent resistance of a previously formed cured product tends to be worsened; however since a di- or higher-valent metal salt of an azo dye (azo dye metal salt according to the invention) is selected, the organic solvent resistance is ensured. That is, in the process of forming a plurality of cured products (colored patterns with a plurality of colors), for example, when a previously formed colored pattern of a first color is overlaid by a colored pattern of a second color, elution of a dye from a previously formed pattern can be prevented and decrease of the color density and hue evenness due to color omission is effectively suppressed.

The concentration of the organic-solvent-soluble dye (including the azo dye metal salt according to the invention) is preferably 50.0 to 80.0% by weight, more preferably 52.5 to 75.0% by weight, and still more preferably 55.0 to 70.0% by weight in the total solid content of the photosensitive composition from the viewpoints of obtaining sufficiently high coloring density even when the film is thin and obtaining curability.

The azo dye metal salt according to the invention to be contained as an organic-solvent-soluble dye in the photosensitive composition according to the invention may be selected from di- or higher-valent metal salts obtained from the azo coloring agents disclosed in, for example, JP-A Nos. 64-90403, 64-91102, 1-94301, and 6-11614; JP Patent No. 2592207; U.S. Pat. Nos. 4,808,501, 5,667,920, and 5,059,500; and JP-A Nos. 5-333207, 6-35183, 6-51115, and 6-194828.

The chemical structure of the dye is preferably a pyrazolone-azo compound, or an anilinoazo, pyrazolotriazole-azo, γ-acid azo, pyridone azo, or anthrapyridone dye.

In view of complete removal of a binder and/or a dye by development, di- or higher-valent metal salts of azo acidic dyes and/or their derivatives can be used preferably in some cases. Besides, di- or higher-valent metal salts of azo dyes among direct dyes, basic dyes, mordant dyes, acidic mordant dyes, azoic dyes, disperse dyes, oil-soluble dyes, food dyes, and/or their derivatives are also usable.

Hereinafter, the invention will be described in detail mainly in the cases of using an acidic dye and its derivatives.

—Acidic Dye and its Derivatives—

The acidic dye is not particularly limited as long as the dye has an acidic group such as a sulfonic group, a carboxy group, or a phenolic hydroxyl and is selected in consideration of all of the required properties such as solubility in an organic solvent and a developer solution to be used for development; salt-formability with a basic compound, a light absorption, interaction with other components in the composition, light fastness, and heat resistance.

The di- or higher-valent metal salt is preferably selected from salts of di- or higher-valent metal cations such as magnesium, calcium, strontium, barium, zinc, aluminum, nickel, copper, cobalt, and iron. Particularly, the above-mentioned "di- or higher-valent metal salts" of at least one dye selected from γ-acid-azo compounds, pyrazolone-azo compounds, and pyridone azo compounds are preferable and the "di- or higher-valent metal salts" of pyridone azo compounds are still more preferable.

The solid content of di- or higher-valent metal salt of the azo organic-solvent-soluble dye (azo dye metal salt according to the invention) is preferably 20.0% by weight or higher in the total amount of the organic-solvent-soluble dye in view of the organic solvent resistance. It is more preferably 25.0% by weight or higher and still more preferably 30.0% by weight or higher. The upper limit is not particularly limited.

The di- or higher-valent metal salt (azo dye metal salt) can be obtained by salt exchange of a commercialized acidic dye. Preferable examples of the azo dye metal salts obtained by the above-mentioned salt exchange are magnesium, calcium, strontium, barium, zinc, aluminum, nickel, copper, cobalt, and iron salts of the following azo acidic dyes, which are commercially available. The invention is not necessarily limited to these exemplary dyes.

acid black 1, 24;

acid blue 29, 42, 70, 92, 113, 120, 158;

acid orange 6, 7, 8, 10, 12, 50, 51, 52, 56, 63;

acid red 1, 4, 8, 14, 17, 18, 26, 27, 29, 31, 34, 35, 37, 42, 44, 57, 66, 73, 88, 111, 114, 133, 134, 138, 145, 150, 151, 158, 176, 183, 198, 249, 266, 308;

acid violet 6, 7;

acid yellow 9, 11, 17, 23, 25, 29, 34, 36, 38, 40, 42, 54, 65, 72, 76, 99, 172, 199, 220, 228;

Direct Yellow 2, 33, 34, 50, 69, 70, 86;

Direct Orange 34, 41, 61, 70, 96;

Direct Red 79, 83, 84, 98, 99, 173, 176, 181, 243, 250;

Direct Violet 66, 79, 80, 81, 103;

Direct Blue 80, 81, 84, 93, 95, 98, 149, 150, 158, 159, 162, 163, 164, 166, 167, 214;

Direct Green 34;

Mordant Yellow 5, 8, 10, 16, 20, 26, 30, 45;

Mordant Orange 3, 4, 29, 35, 37;

Mordant Red 17, 19, 26, 30, 32, 39, 41, 71, 74, 90, 94;

Mordant Violet 2, 4, 5, 30, 40, 41, 44;

Mordant Blue 7, 9, 13, 31, 44;

Mordant Green 10, 15, 26, 34;

Food yellow 3;

Solvent Blue 35, 37.

Further preferable organic-solvent-soluble dyes in form of di- or higher-valent metal salts (azo dye metal salts) among the above exemplary dyes are magnesium, calcium, strontium, barium, zinc, aluminum, nickel, copper, cobalt, and iron salts of the following azo acidic dyes.

acid orange 56, 63;

acid red 34, 37, 42, 57, 198, 266;

acid yellow 11, 17, 23, 25, 29, 34, 40, 42, 54, 72, 76, 172;

Direct Yellow 70;

Direct Orange 96;

Direct Red 173;

Mordant Yellow 8, 30, 45;

Mordant Orange 3, 4, 29, 35, 37;

Mordant Red 17, 19, 26, 39, 41, 71, 74, 90, 94.

Still more preferable organic-solvent-soluble dyes in form of di- or higher-valent metal salts (azo dye metal salts) among the above exemplary dyes are magnesium, calcium, strontium, barium, zinc, aluminum, nickel, copper, cobalt, and iron salts of the following azo acidic dyes.

acid red 42, 57, 198, 266;

acid yellow 11, 25, 29, 34, 40, 72, 76, 172;

Mordant Orange 3, 4, 29, 37;

Mordant Red 17, 19, 39, 71, 94.

Besides the above exemplary dyes, it is still more preferable to use the following azo dye metal salts represented by the following formula (I) among di- or higher-valent metal salts of pyridone azo dyes as di- or higher-valent metal salts of organic-solvent-soluble dyes.

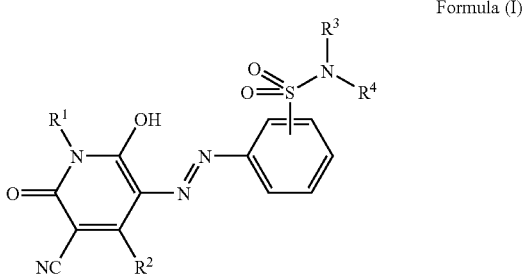

Formula (I)

In the above formula (I), $R^1$, $R^3$ and $R^4$ each independently represent a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms, or a heteroatom-containing substituent group; at least one of $R^1$, $R^3$, or $R^4$ contains at least one of —$SO_3M$ or COOM (M represents a cation of di- or higher-valent metal atom) as a substituent group; $R^3$ and $R^4$ may form a heterocycle in combination with a nitrogen atom bonded thereto; $R^2$ represents an alkyl group having 1 to 10 carbon atoms, a methoxymethyl group, or a trifluoromethyl group.

In the above formula (I), $R^1$, $R^3$ and $R^4$ each independently represent a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms, or a "heteroatom-containing substituent group"; at least one of $R^1$, $R^3$, or $R^4$ contains at least one of —$SO_3M$ or COOM (M represents a cation of di- or higher-valent metal atom) as a substituent group; $R^3$ and $R^4$ may form a heterocycle in combination with a nitrogen atom bonded thereto; and $R^1$, $R^3$ and $R^4$ may further have substituent groups.

The alkyl group having 1 to 21 carbon atoms represented by any of $R^1$, $R^3$ and $R^4$ may be unsubstituted or substituted. The alkyl group is preferably an alkyl group having 1 to 15 carbon atoms and more preferably an alkyl group having 1 to 10 carbon atoms.

The alkyl group having 1 to 21 carbon atoms represented by any of $R^1$, $R^3$ and $R^4$ may be a straight, branched, or cyclic alkyl group and preferable examples thereof include methyl, ethyl, n-propyl, n-butyl, n-amyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, n-eicosanyl, iso-propyl, sec-butyl, iso-butyl, tert-butyl, 1-methylbutyl, 1-ethylpropyl, 2-methylbutyl, iso-amyl, neopentyl, 1,2-dimethylpropyl, 1,1-dimethylpropyl, tert-amyl, 1,3-dimethylbutyl, 3,3-dimethylbutyl, 2-ethylbutyl, 2-ethyl-2-methylpropyl, straight or branched heptyl, 1-methylheptyl, 2-ethylhexyl, 1,5-dimethylhexyl, tert-octyl, branched nonyl, branched decyl, branched undecyl, branched dodecyl, branched tridecyl, branched tetradecyl, branched pentadecyl, branched hexadecyl, branched heptadecyl, branched octadecyl, straight or branched nonadecyl, straight or branched eicosanyl, cyclopropyl, cyclopropylmethyl, cyclobutyl, cyclobutylmethyl, cyclopentyl, cyclohexyl, cyclohexylmethyl, cycloheptyl, cyclooctyl, cyclohexylpropyl, cyclododecyl, norbornyl, bornyl, cis-myrtanyl, isopinocanphenyl, noradamantyl, adamantyl, adamantylmethyl, 1-(1-adamantyl)ethyl, 3,5-dimethyladamantyl, quinuclidinyl, cyclopentylethyl, and bicyclooctyl groups.

More preferable examples as the alkyl group having 1 to 21 carbon atoms represented by any of $R^1$, $R^3$ and $R^4$ among the above-exemplified alkyl groups include methyl, ethyl, n-propyl, n-butyl, n-amyl, n-hexyl, n-heptyl, n-octyl, n-nonyl, n-decyl, n-undecyl, n-dodecyl, n-tridecyl, n-tetradecyl, iso-propyl, sec-butyl, iso-butyl, tert-butyl, 1-methylbutyl, 1-ethylpropyl, 2-methylbutyl, iso-amyl, neopentyl, 1,2-dimethylpropyl, 1,1-dimethylpropyl, tert-amyl, 1,3-dimethylbutyl, 3,3-dimethylbutyl, 2-ethylbutyl, 2-ethyl-2-methylpropyl, straight or branched heptyl, 1-methylheptyl, 2-ethylhexyl, 1,5-dimethylhexyl, tert-octyl, branched nonyl, branched decyl, branched undecyl, branched dodecyl, branched tridecyl, branched tetradecyl, cyclopropyl, cyclopropylmethyl, cyclobutyl, cyclobutylmethyl, cyclopentyl, cyclohexyl, cyclohexylmethyl, cycloheptyl, cyclooctyl, cyclohexylpropyl, cyclododecyl, norbornyl, bornyl, cis-myrtanyl, isopinocanphenyl, noradamantyl, adamantyl, adamantylmethyl, 1-(1-adamantyl)ethyl, 3,5-dimethyladamantyl, quinuclidinyl, cyclopentylethyl, and bicyclooctyl groups.

Still more preferable examples as the alkyl group having 1 to 21 carbon atoms represented by any of $R^1$, $R^3$ and $R^4$ among the above-exemplified alkyl groups include methyl, ethyl, n-propyl, n-butyl, n-amyl, n-hexyl, n-heptyl, n-octyl, n-nonyl, n-decyl, iso-propyl, sec-butyl, iso-butyl, tert-butyl, 1-methylbutyl, 1-ethylpropyl, 2-methylbutyl, iso-amyl, neopentyl, 1,2-dimethylpropyl, 1,1-dimethylpropyl, tert-amyl, 1,3-dimethylbutyl, 3,3-dimethylbutyl, 2-ethylbutyl, 2-ethyl-2-methylpropyl, straight or branched heptyl, 1-methylheptyl, 2-ethylhexyl, 1,5-dimethylhexyl, tert-octyl, branched nonyl, branched decyl, cyclopropyl, cyclopropylmethyl, cyclobutyl, cyclobutylmethyl, cyclopentyl, cyclohexyl, cyclohexylmethyl, cycloheptyl, cyclooctyl, cyclohexylpropyl, cyclododecyl, norbornyl, bornyl, noradamantyl, adamantyl, adamantylmethyl, 1-(1-adamantyl)ethyl, 3,5-dimethyladamantyl, cyclopentylethyl, and bicyclooctyl groups.

In view of the heat resistance improvement, still more preferable examples as the alkyl group having 1 to 21 carbon atoms represented by any of $R^1$, $R^3$ and $R^4$ among the above-exemplified alkyl groups include ethyl, n-propyl, n-butyl, n-amyl, n-hexyl, n-heptyl, n-octyl, n-nonyl, n-decyl, and branched alkyls and cyclic alkyls such as iso-propyl, sec-butyl, iso-butyl, tert-butyl, 1-methylbutyl, 1-ethylpropyl, 2-methylbutyl, iso-amyl, neopentyl, 1,2-dimethylpropyl, 1,1-dimethylpropyl, tert-amyl, 1,3-dimethylbutyl, 3,3-dimethylbutyl, 2-ethylbutyl, 2-ethyl-2-methylpropyl, branched heptyl, 1-methylheptyl, 2-ethylhexyl, 1,5-dimethylhexyl, tert-octyl, branched nonyl, branched decyl, cyclopropyl, cyclopropylmethyl, cyclobutyl, cyclobutylmethyl, cyclopentyl, cyclohexyl, cyclohexylmethyl, cycloheptyl, cyclooctyl, cyclohexylpropyl, cyclododecyl, norbornyl, bornyl, noradamantyl, adamantyl, adamantylmethyl, 1-(1-adamantyl)ethyl, 3,5-dimethyladamantyl, cyclopentylethyl, and bicyclooctyl groups.

With respect to the above-exemplified alkyl groups, those substituted by fluorine are also particularly preferable. Examples of the fluorine-substituted alkyl groups include trifluoromethyl, trifluoroethyl, pentafluoroethyl, heptafluoropropyl, nonafluorobutyl, tridecafluorohexyl, pentadecafluoroheptyl, heptadecafluorooctyl, tridecafluorooctyl, nonadecafluorononyl, heptadecafluorodecyl, and perfluorodecyl, and more preferable examples among them include trifluoromethyl, pentafluoroethyl, heptafluoropropyl, nonafluorobutyl, tridecafluorohexyl, and pentadecafluoroheptyl groups, and still more preferable examples among them include trifluoromethyl, pentafluoroethyl, heptafluoropropyl, nonafluorobutyl, and tridecafluorohexyl groups.

The alkenyl group having 2 to 21 carbon atoms represented by any of $R^1$, $R^3$, and $R^4$ may be unsubstituted or substituted. An alkenyl group having 2 to 15 carbon atoms is more preferable and an alkenyl group having 2 to 10 carbon atoms is still more preferable.

Preferable examples of the alkenyl group having 2 to 21 carbon atoms represented by any of $R^1$, $R^3$, and $R^4$ include vinyl, isopropenyl, 2-propenyl, 2-methyl-propenyl, 1-methyl-1-propenyl, 1-butenyl, 3-butenyl, 1-methyl-1-butenyl, 1,1-dimethyl-3-butenyl, 1-pentenyl, 2-pentenyl, 1-ethyl-1-pentenyl, 1-hexenyl, 1-heptenyl, 2,6-dimethyl-5-heptenyl, 9-decenyl, 1-cyclopentenyl, 2-cyclopentenylmethyl, cyclohexenyl, 1-methyl-2-cyclohexenyl, 1,4-dihydro-2-methylphenyl, octenyl, citronellyl, oleyl, geranyl, fernesyl, and 2-(1-cyclohexenyl)ethyl groups.

More preferable examples of the alkenyl group having 2 to 21 carbon atoms represented by any of $R^1$, $R^3$, and $R^4$ among them include vinyl, isopropenyl, 2-propenyl, 2-methyl-propenyl, 1-methyl-1-propenyl, 1-butenyl, 3-butenyl, 1-methyl-1-butenyl, 1,1-dimethyl-3-butenyl, 1-pentenyl, 2-pentenyl, 1-ethyl-1-pentenyl, 1-hexenyl, 1-heptenyl, 1-cyclopentenyl, 2-cyclopentenylmethyl, cyclohexenyl, 1-methyl-2-cyclohexenyl, and 1,4-dihydro-2-methylphenyl groups, and still more examples include vinyl, isopropenyl, 2-propenyl, 2-methyl-propenyl, 1-methyl-1-propenyl, 1-butenyl, 3-butenyl, 1-methyl-1-butenyl, 1,1-dimethyl-3-butenyl, 1-pentenyl, 2-pentenyl, 1-ethyl-1-pentenyl, 1-hexenyl, 1-cyclopentenyl, 2-cyclopentenylmethyl, cyclohexenyl, 1-methyl-2-cyclohexenyl, and 1,4-dihydro-2-methylphenyl groups.

The aryl group having 6 to 21 carbon atoms represented by any of $R^1$, $R^3$, and $R^4$ may be unsubstituted or substituted. The aryl group is preferably an aryl group having 6 to 15 carbon atoms and more preferably an aryl group having 6 to 10 carbon atoms.

Examples of the aryl group having 6 to 21 carbon atoms represented by any of $R^1$, $R^3$, and $R^4$ include phenyl, naphthyl, biphenylenyl, acenaphthenyl, fluorenyl, anthracenyl, anthraquinonyl, and pyrenyl groups; more preferable examples among them are phenyl, naphthyl, biphenylenyl, acenaphthenyl, fluorenyl, and anthracenyl groups; and still more preferable examples among them are phenyl, naphthyl, biphenylenyl, and fluorenyl groups.

The aralkyl group having 7 to 21 carbon atoms represented by any of $R^1$, $R^3$, and $R^4$ may be unsubstituted or substituted. The aralkyl group is preferably an aralkyl group having 7 to 15 carbon atoms and more preferably an aralkyl group having 7 to 10 carbon atoms.

Examples of the aralkyl group having 7 to 21 carbon atoms include benzyl, diphenylmethyl, 1,2-diphenylethyl, phenylcyclopentylmethyl, α-methylbenzyl, phenylethyl, α-methyl-phenylethyl, β-methyl-phenylethyl, 3-phenylpropyl, 3,3-diphenylpropyl, 4-phenylbutyl, naphthylmethyl, styryl, cinnamyl, fluorenyl, 1-benzocyclobutenyl, 1,2,3,4-tetrahydronaphthyl, indanyl, piperonyl, and pyrenemethyl groups.

Preferable examples of the aralkyl group having 7 to 21 carbon atoms among them include benzyl, phenyl-cyclopentylmethyl, α-methylbenzyl, phenylethyl, α-methyl-phenylethyl, β-methyl-phenylethyl, 3-phenylpropyl, 4-phenylbutyl, styryl, cinnamyl, fluorenyl, 1-benzocyclobutenyl, and 1,2,3,4-tetrahydronaphthyl groups, and still more preferable examples among them are benzyl, α-methylbenzyl, phenylethyl, α-methyl-phenylethyl, β-methyl-phenylethyl, 3-phenylpropyl, styryl, cinnamyl, fluorenyl, 1-benzocyclobutenyl, and 1,2,3,4-tetrahydronaphthyl groups.

The above-mentioned group represented by any of $R^1$, $R^3$, and $R^4$ may contain ether group and tetrahydrofurfuryl and 2,5-dihydro-2,5-dimethoxyfurfuryl are also preferable.

The group represented by any of $R^1$, $R^3$, and $R^4$ may a "heteroatom-containing substituent group" and the "heteroatom-containing substituent group" is not particularly limited as long as it is derived from an amine having a heteroatom (e.g. nitrogen atom, sulfur atom, and oxygen atom) usable for synthesis of pyridone ring. $R^1$ may be unsubstituted or may have a substituent group.

The "heteroatom-containing substituent group" represented by $R^1$ is preferably a substituent group having 3 to 50 atoms in total from the viewpoint of chromatic valence, more preferably a substituent group having 3 to 40 atoms in total, still more preferably a substituent group having 3 to 30 atoms in total, and still more preferably a substituent group having 3 to 30 atoms in total and having at least one of a nitrogen atom, a sulfur atom, or an oxygen atom.

The "heteroatom-containing substituent group" can be introduced by cyclization of an amide compound obtained by reaction of, for example, cyanoacetic acid and a primary amine, into pyridone ring. Therefore, examples of the "heteroatom-containing substituent group" represented by $R^1$ may include groups derived from primary amines having heteroatoms as described in "Aldrich Structure Indexes".

Specific examples of the "heteroatom-containing substituent group" represented by $R^1$ include 2-methoxyethyl, 3-methoxypropyl, 3-ethoxypropyl, 3-butoxypropyl, 2-methoxy-1-methylethyl, tetrahydrofurfuryl, hydroxyethyl, hydroxypropyl, 4-hydroxybutyl, 2-hydroxy-1-methyl-ethyl, hydroxyethoxyethyl, 3-N-morpholinopropyl, 2-N-morpholinoethyl, 3-N-pyrolidinonylpropyl, 2-dimethylaminoethyl, 3-dimethylaminopropyl, 3-diethylaminopropyl, 2-N-pyrolidinylethyl, 2-(N-methyl-2-pyrolidinyl)ethyl, 2-N-pyperidinylethyl, 3-(2-methyl-N-pipelidinyl)propyl, and 3-isopropoxypropyl groups.

More preferable examples among them include 3-methoxypropyl, 3-ethoxypropyl, 2-methoxy-1-methylethyl, tetrahydrofurfuryl, hydroxyethyl, hydroxypropyl, 4-hydroxybutyl, 2-hydroxy-1-methyl-ethyl, hydroxyethoxyethyl, 3-N-morpholinopropyl, 2-N-morpholinoethyl, 3-N-pyrolidinonylpropyl, 2-dimethylaminoethyl, 3-dimethylaminopropyl, 3-diethylaminopropyl, 2-N-pyrolidinylethyl, 2-(N-methyl-2-pyrolidinyl)ethyl, 2-N-pyperidinylethyl, 3-(2-methyl-N-pipelidinyl)propyl, and 3-isopropoxypropyl groups, and still more preferable examples among them are 3-methoxypropyl, 2-methoxy-1-methylethyl, tetrahydrofurfuryl, hydroxyethyl, hydroxypropyl, 4-hydroxybutyl, hydroxyethoxyethyl, 3-N-morpholinopropyl, 2-N-morpholinoethyl, 3-N-pyrolidinonylpropyl, 3-dimethylaminopropyl, 3-diethylaminopropyl, 2-(N-methyl-2-pyrolidinyl)ethyl, 2-N-pyperidinylethyl, 3-(2-methyl-N-pipelidinyl)propyl, and 3-isopropoxypropyl groups.

Further, still more preferable examples of the "heteroatom-containing substituent group" represented by $R^1$ among them are 3-methoxypropyl, tetrahydrofurfuryl, hydroxypropyl, 4-hydroxybutyl, hydroxyethoxyethyl, 3-N-morpholinopropyl, 2-N-morpholinoethyl, 3-N-pyrolidinonylpropyl, 3-dimethylaminopropyl, 2-(N-methyl-2-pyrolidinyl)ethyl, 2-N-pyperidinylethyl, 3-(2-methyl-N-pipelidinyl)propyl, and 3-isopropoxypropyl groups.

Also, when $R^3$ and/or $R^4$ represents the "heteroatom-containing substituent group", the "heteroatom-containing substituent group" represented by $R^3$ and/or $R^4$ is not particularly limited as long as it is a group derived from an amine having a heteroatom (e.g. nitrogen atom, sulfur atom, and oxygen atom) usable for synthesis of sulfonamide.

$R^3$ and/or $R^4$ may be unsubstituted or may have a substituent group. The "heteroatom-containing substituent group" represented by $R^3$ and/or $R^4$ is preferably a substituent group having 3 to 50 atoms in total from a viewpoint of chromatic valence, more preferably a substituent group having 3 to 40 atoms in total, still more preferably a substituent group having 3 to 30 atoms in total, and still more preferably a substituent group having 3 to 30 atoms in total and having at least one of a nitrogen atom, a sulfur atom, or an oxygen atom.

When $R^3$ and/or $R^4$ represents the "heteroatom-containing substituent group", the group can be introduced by reaction of nitrobenzenesulfonyl chloride and a primary or secondary amine. Examples of the "heteroatom-containing substituent group" represented by $R^3$ and/or $R^4$ include groups derived from primary or secondary amines having heteroatoms as described in "Aldrich Structure Indexes" and their derivatives.

Specific examples of the "heteroatom-containing substituent group" represented by any of $R^3$ and $R^4$ include 2-methoxyethyl, 3-methoxypropyl, 3-ethoxypropyl, 3-butoxypropyl, 2-methoxy-1-methylethyl, tetrahydrofurfuryl, 2-hydroxyethyl, 2-hydroxypropyl, 4-hydroxybutyl, 2-hydroxy-1-methyl-ethyl, hydroxyethoxyethyl, 3-N-morpholinopropyl, 2-N-morpholinoethyl, 3-N-pyrolidinonylpropyl, 2-dimethylaminoethyl, 3-dimethylaminopropyl, 3-diethylaminopropyl, 2-N-pyrolidinylethyl, 2-(N-methyl-2-pyrolidinyl)ethyl, 2-N-pyperidinylethyl, 3-(2-methyl-N-pipelidinyl)propyl, 3-isopropoxypropyl, diethylaminoethyl, 2,2-dimethoxyethyl, 1,3-dioxolane-2-yl-methyl, 3-hydroxypropyl, and 2-mercaptoethyl groups.

Preferable examples of the "heteroatom-containing substituent group" represented by any of $R^3$ and $R^4$ among them include 3-methoxypropyl, 3-ethoxypropyl, 2-methoxy-1-methylethyl, tetrahydrofurfuryl, 2-hydroxyethyl, 2-hydroxypropyl, 4-hydroxybutyl, 2-hydroxy-1-methyl-ethyl, hydroxyethoxyethyl, 3-N-morpholinopropyl, 2-N-morpholinoethyl, 3-N-pyrolidinonylpropyl, 2-dimethylaminoethyl, 3-dimethylaminopropyl, 3-diethylaminopropyl, 2-N-pyrolidinylethyl, 2-(N-methyl-2-pyrolidinyl)ethyl, 2-N-pyperidinylethyl, 3-(2-methyl-N-pipelidinyl)propyl, 3-isopropoxypropyl, diethylaminoethyl, 2,2-dimethoxyethyl, 1,3-dioxolane-2-yl-methyl, 3-hydroxypropyl, and 2-mercaptoethyl groups, and still more preferable examples among them are 3-methoxypropyl, 2-methoxy-1-methylethyl, tetrahydrofurfuryl, 2-hydroxyethyl, 2-hydroxypropyl, 4-hydroxybutyl, hydroxyethoxyethyl, 3-N-morpholinopropyl, 2-N-morpholinoethyl, 3-N-pyrolidinonylpropyl, 3-dimethylaminopropyl, 3-diethylaminopropyl, 2-(N-methyl-2-pyrolidinyl)ethyl, 2-N-pyperidinylethyl, 3-(2-methyl-N-pipelidinyl)propyl, 3-isopropoxypropyl, diethylaminoethyl, 2,2-dimethoxyethyl, 1,3-dioxolane-2-yl-methyl, 3-hydroxypropyl, and 2-mercaptoethyl groups.

Further, still more preferable examples among them are 3-methoxypropyl, tetrahydrofurfuryl, 2-hydroxypropyl, 4-hydroxybutyl, hydroxyethoxyethyl, 3-N-morpholinopropyl, 2-N-morpholinoethyl, 3-N-pyrolidinonylpropyl, 3-dimethylaminopropyl, 2-(N-methyl-2-pyrolidinyl)ethyl, 2-N-pyperidinylethyl, 3-(2-methyl-N-pipelidinyl)propyl, 3-isopropoxypropyl, diethylaminoethyl, 2,2-dimethoxyethyl, 1,3-dioxolane-2-yl-methyl, 3-hydroxypropyl, and 2-mercaptoethyl groups.

As described above, $R^3$ and $R^4$ may form a heterocycle in combination with the nitrogen atom bonded thereto. In that case, preferable examples of the heteroring include 2-methylazilidine ring, azetidine ring, pyrrolidine ring, 3-pyroline ring, piperidine ring, 1,2,3,6-tetrahydropyridine ring, hexamethyleneimine ring, piperazine ring, 1,3,3-trimethyl-6-azabicyclo[3.2.1]octane ring, decahydroquinoline ring, oxazolidine ring, morpholine ring, thiazolidine ring, thiomorpholine ring, indoline ring, isoindoline, 1,2,3,4-tetrahydrocarbazole ring, 1,2,3,4-tetrahydroquinoline ring, 1,2,3,4-tetrahydroisoquinoline ring, iminodibenzyl ring, phenoxazine ring, phenothiazine ring, and phenazine ring.

More preferable examples of the heterocycle formed from $R^3$ and $R^4$ among them are pyrrolidine ring, 3-pyroline ring, piperidine ring, 1,2,3,6-tetrahydropyridine ring, hexamethyleneimine ring, piperazine ring, decahydroquinoline ring, oxazolidine ring, morpholine ring, thiazolidine ring, and thiomorpholine ring and still more preferable examples are pyrrolidine ring, 3-pyroline ring, piperidine ring, 1,2,3,6-tetrahydropyridine ring, piperazine ring, decahydroquinoline ring, oxazolidine ring, morpholine ring, thiazolidine ring, and thiomorpholine ring.

When the groups represented by any of $R^1$, $R^3$, and $R^4$ and the heterocycle formed from $R^3$, $R^4$, and the nitrogen atom have substituent groups, examples of the substituent groups include acyl groups, acylamino groups, acylaminocarbonylamino groups, aralkylaminocarbonylamino groups, arylaminocarbonylamino groups, methacryloylaminocarbonylamino groups, alkoxycarbonyl groups, a trilfluoromethyl group, a fluoro group, a chloro group, a bromo group, an iodo group, a hydroxyl group, a nitro group, a methyl group, an ethyl group, a n-propyl group, an iso-propyl group, a n-butyl group, an iso-butyl group, a sec-butyl group, a tert-butyl group, a pentyl group, a hexyl group, a heptyl group, an octyl group, a vinyl group, a methoxy group, an ethoxy group, a butoxy group, an isopropoxy group, a tert-butoxy group, a cyclohexyloxy group, a vinyloxy group, a methylthio group, an ethylthio group, a pyrrolidinyl group, a piperidinyl group, a piperazinyl group, an amino group, a dimethylamino group, a diethylamino group, a phenyl group, —$SO_3M$ and —COOM (M represents hydrogen or a cation of metal atom or a nitrogen-containing compound).

More preferable examples among them include acyl groups (particularly, acetyl), acylamino groups, acylaminocarbonylamino groups, alkoxycarbonyl groups, a trifluoromethyl group, a fluoro group, a chloro group, a bromo group, a hydroxyl group, a nitro group, a methyl group, an ethyl group, a n-propyl group, an iso-propyl group, a n-butyl group, an iso-butyl group, a sec-butyl group, a tert-butyl group, a pentyl group, a hexyl group, a vinyl group, a methoxy group, an ethoxy group, a butoxy group, an isopropoxy group, a tert-butoxy group, a cyclohexyloxy group, a vinyloxy group, a methylthio group, an ethylthio group, a pyrrolidinyl group, a piperidinyl group, a piperazinyl group, an amino group, a dimethylamino group, a diethylamino group, a phenyl group, —$SO_3M$ and —COOM (M represents hydrogen or a cation of metal atom or a nitrogen-containing compound), and still more preferable examples are acyl groups (particularly, acetyl), acylamino groups, acylaminocarbonylamino groups, alkoxycarbonyl groups, a trifluoromethyl group, a fluoro group, a chloro group, a bromo group, a hydroxyl group, a nitro group, a methyl group, an ethyl group, a n-propyl group, an iso-propyl group, a n-butyl group, an iso-butyl group, a tert-butyl group, a hexyl group, a vinyl group, a methoxy group, an ethoxy group, an isopropoxy group, a cyclohexyloxy group, a vinyloxy group, a methylthio group, an ethylthio group, a pyrrolidinyl group, a piperidinyl group, a piperazinyl group, an amino group, a dimethylamino group, a diethylamino group, a phenyl group, —$SO_3M$ and —COOM (M represents hydrogen or a cation of metal atom or a nitrogen-containing compound).

The above-exemplified substituent groups may be substituted by such substituents multiply.

Particularly, when these substituent groups are those having an active hydrogen of a hydroxyl group, an amino group, or the like, these substituent groups may be substituted by an acetyl, acyl, (meth)acryloyl, alkylaminocarbonyl, arylaminocarbonyl (e.g. butylaminocarbonyl, phenylaminocarbonyl, or the like), alkyl, or aralkyl group by reaction with various acid chlorides, acid anhydrides, halides, or various isocyanates.

At least one of $R^1$, $R^3$, or $R^4$ contains at least one group selected from —$SO_3M$ groups and —COOM groups (M represents a cation of di- or higher-valent metal atom) as a substituent group or substituent groups.

Examples of the "cation of di- or higher-valent metal atom" represented by M include cations of Mg, Ca, Sr, Ba, Zn, Al, Ni, Cu, Co and Fe. Among them cations of Mg, Ca, Sr, Al, Cu, and Fe more are preferable, and cations of Mg, Sr, Al and Cu are still more preferable.

The alkyl, alkenyl, aryl, or aralkyl group represents by any of $R^1$, $R^3$, and $R^4$ and the heterocycle formed from $R^3$, $R^4$, and a nitrogen atom may be substituted by the groups that are listed as examples of $R^1$, $R^3$, and $R^4$.

In view of the chromatic valence (ε/Mw), the formula weight of the groups represented by $R^1$, $R^3$, and $R^4$ is preferably 500 or less in total of $R^1$, $R^3$, and $R^4$, more preferably 400 or less, and still more preferably 300 or less. When the groups represented by $R^3$ and $R^4$ have substituent groups, the number of the substituent groups on each of $R^3$ and $R^4$ is preferably 0 to 4, more preferably 0 to 3, and still more preferably 0 to 2.

$R^2$ in the formula (I) represents an alkyl group having 1 to 10 carbon atoms, a methoxymethyl group, or a trifluoromethyl group; and the alkyl group is preferably an alkyl group having 1 to 5 carbon atoms. $R^2$ may be unsubstituted or may have a substituent group.

Specific examples of the alkyl group represented by $R^2$ include methyl, ethyl, n-propyl, isopropyl, tert-butyl, methoxymethyl, and trifluoromethyl groups; among them, methyl, ethyl, isopropyl, tert-butyl, methoxymethyl, and trifluoromethyl groups are preferable, and methyl, isopropyl, methoxymethyl, and trifluoromethyl groups are more preferable.

When the group represented by $R^2$ has a substituent group, preferable examples include a halogen atom, an alkyl group, and an alkenyl group. Chlorine, fluorine, methyl, ethyl, propyl, butyl, and 2-butenyl groups are more preferable, and chlorine, methyl, ethyl, propyl, butyl, and 2-butenyl groups are still more preferable.

Specific examples (exemplary compounds (M1) to (M12)) of the azo dye metal salts represented by the formula (I) are shown below. The azo dye metal salts in the invention are not limited to these examples.

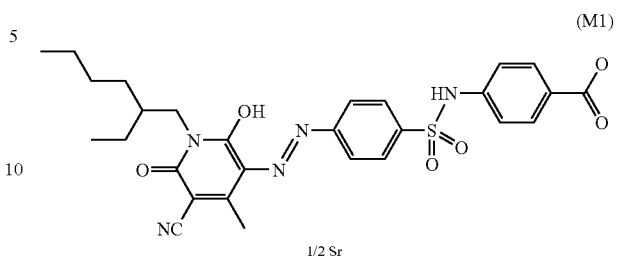

(M1)

1/2 Sr

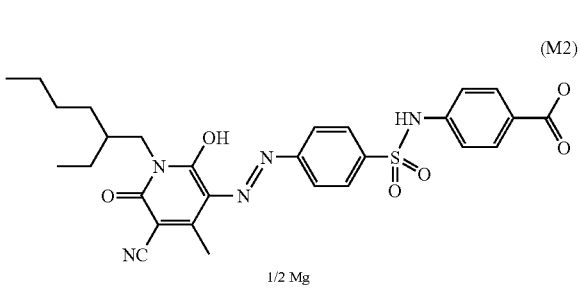

(M2)

1/2 Mg

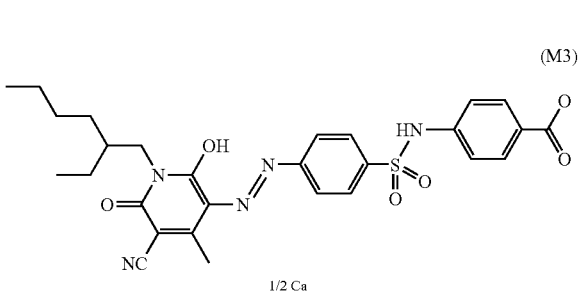

(M3)

1/2 Ca

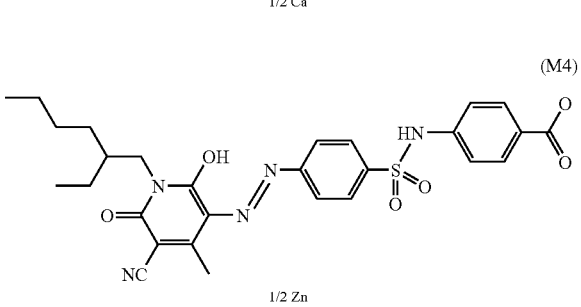

(M4)

1/2 Zn

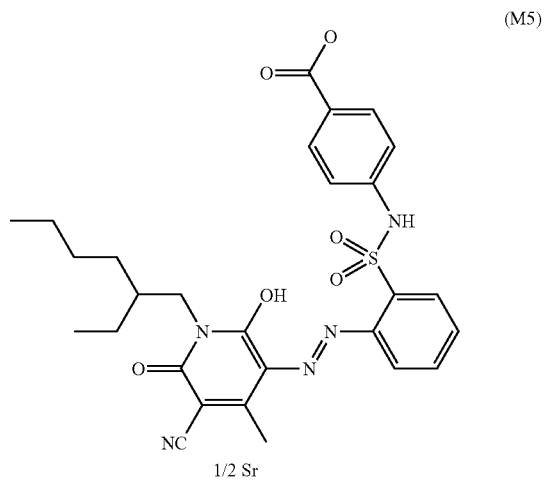

(M5)

1/2 Sr

-continued

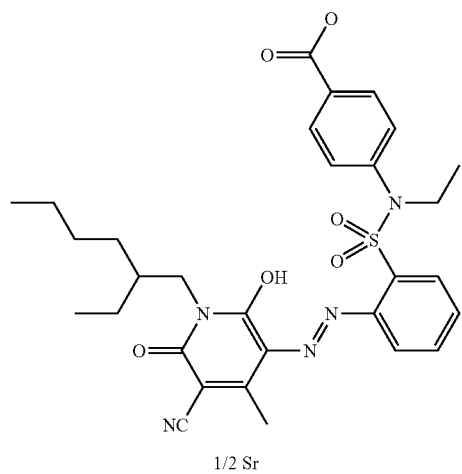
(M6)
1/2 Sr

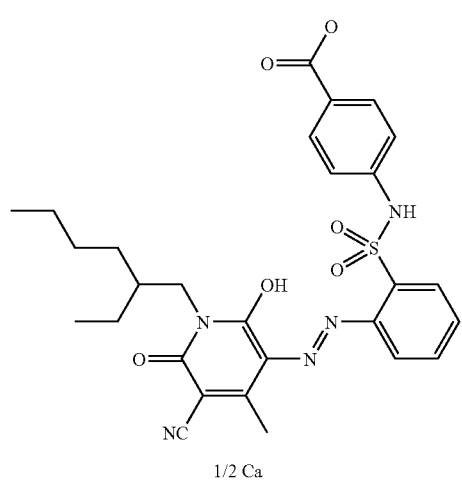
(M7)
1/2 Ca

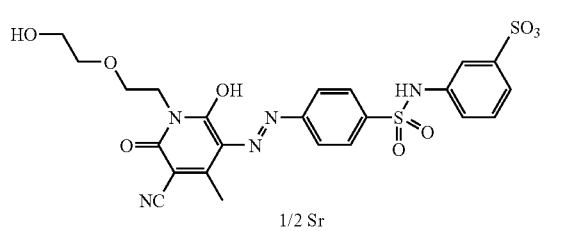
(M8)
1/2 Sr

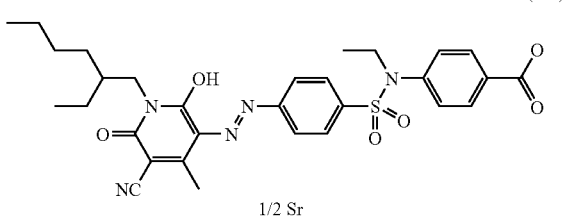
(M9)
1/2 Sr

-continued

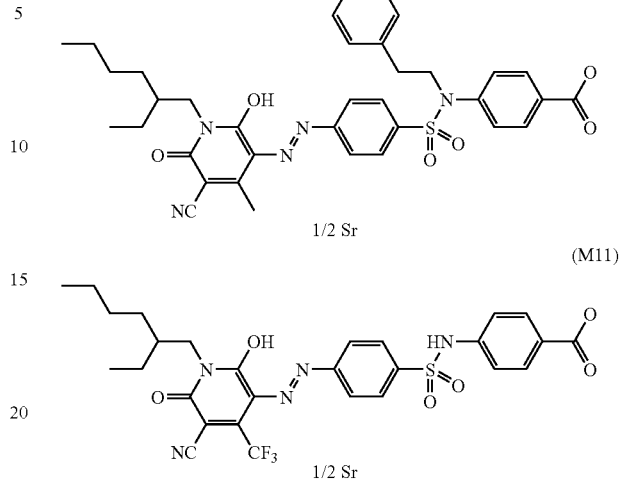
(M10)
1/2 Sr (M11)
1/2 Sr

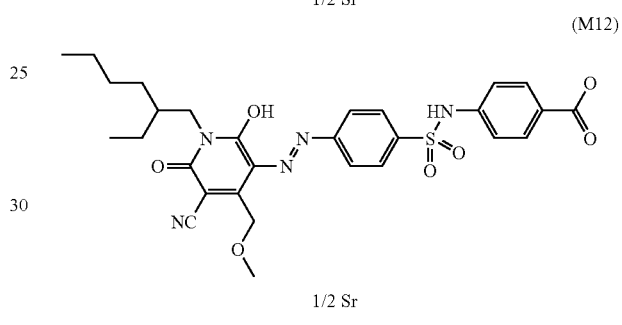
(M12)
1/2 Sr

Two or more azo dye metal salts according to the invention may be used in combination. Dyes other than the azo dye metal salts according to the invention may be used additionally. Examples of such additional dyes include dyes other than azos and azo dyes in the form other than metal salts among coloring materials disclosed in JP-A Nos. 64-90403, 64-91102, 1-94301, and 6-11614; JP Patent No. 2592207; U.S. Pat. Nos. 4,808,501, 5,667,920, and 5,059,500; and JP-A Nos. 5-333207, 6-35183, 6-51115, and 6-194828.

The chemical structure of non-azo dyes may be a dye selected from triphenylmethane, anthraquinone, benzylidene, oxonol, cyanine, phenothiazine, pyrrolopyrazole azomethine, xanthene, phthalocyanine, benzopyran, and indigo dyes.

Similarly to the case of the azo dye metal salts according to the invention, acidic dyes and/or derivatives thereof, direct dyes, basic dyes, mordant dyes, acidic mordant dyes, azoic dyes, disperse dyes, oil-soluble dyes, and food dyes, and/or their derivatives are also usable. The acidic dyes and derivatives thereof are as described above.

Specific examples of commercialized acidic dyes other than azo dyes are described below. However, acidic dyes usable in the invention are not limited to these examples.

acid alizarin violet N;

acid black 2, 48;

acid blue 1, 7, 9, 15, 18, 23, 25, 27, 40, 45, 51, 62, 74, 80, 83, 86, 87, 90, 96, 103, 108, 112, 129, 138, 147, 150, 171, 182, 192, 210, 242, 243, 249, 256, 259, 267, 278, 280, 285, 290, 296, 315, 324; 1, 335, 340.

acid chrome violet K;

acid Fuchsin;

acid green 1, 3, 5, 9, 16, 25, 27, 50, 58, 63, 65, 80, 104, 105, 106, 109;

acid orange 26, 62, 64, 74, 75, 94, 95, 107, 108, 169, 173;

acid red 50, 51, 52, 80, 87, 91, 92, 94, 97, 103, 129, 143, 182, 206, 211, 215, 216, 217, 227, 228, 252, 257, 258, 260, 261, 268, 270, 274, 277, 280, 281, 312, 315, 316, 339, 341, 345, 346, 349, 382, 383, 394, 401, 412, 417, 418, 422, 426;

acid violet 6B, 9, 17, 19, 49;

acid yellow 1, 3, 7, 73, 79, 98, 111, 112, 113, 114, 116, 119, 123, 128, 134, 135, 138, 139, 140, 144, 150, 155, 157, 160, 161, 163, 168, 169, 177, 178, 179, 184, 190, 193, 196, 197, 202, 203, 204, 205, 207, 212, 214, 221, 230, 232, 235, 238, 240, 242, 243, 251;

Direct Yellow 35, 38, 39, 43, 47, 54, 58, 68, 71, 93, 94, 95, 98, 102, 108, 109, 129, 136, 138, 141;

Direct Orange 39, 46, 50, 52, 56, 57, 64, 65, 68, 97, 106, 107;

Direct Red 82, 91, 92, 96, 97, 105, 106, 107, 172, 177, 179, 182, 184, 204, 207, 211, 213, 218, 220, 221, 222, 232, 233, 234, 241, 246;

Direct Violet 47, 52, 54, 59, 60, 65, 82, 84, 89, 90, 93, 95, 96, 104;

Direct Blue 57, 77, 85, 86, 90, 94, 97, 99, 100, 101, 106, 107, 108, 109, 113, 114, 115, 117, 119, 137, 153, 155, 156, 160, 161, 170, 171, 172, 173, 188, 189, 190, 192, 193, 194, 196, 198, 199, 200, 207, 209, 210, 212, 213, 222, 228, 229, 237, 238, 242, 243, 244, 245, 247, 248, 250, 251, 252, 256, 257, 259, 260, 268, 274, 275, 293;

Direct Green 25, 27, 31, 32, 37, 63, 65, 66, 67, 68, 69, 72, 77, 79, 82;

Mordant Yellow 31, 33, 42, 43, 56, 61, 62, 65;

Mordant Orange 5, 8, 12, 13, 14, 20, 21, 23, 24, 28, 32, 34, 36, 42, 43, 47, 48;

Mordant Red 1, 2, 3, 4, 9, 11, 12, 14, 18, 22, 23, 24, 25, 33, 36, 37, 38, 43, 45, 46, 48, 53, 56, 63, 85, 86, 88, 95;

Mordant Violet 1, 7, 14, 22, 24, 31, 32, 37, 45, 47, 48, 53, 58;

Mordant Blue 1, 2, 3, 8, 12, 15, 16, 19, 20, 21, 22, 23, 24, 26, 30, 32, 39, 40, 41, 43, 48, 49, 53, 61, 74, 77, 83, 84;

Mordant Green 1, 3, 4, 5, 19, 29, 33, 35, 41, 43, 53;

Solvent Yellow 14, 82, 94, 162;

Solvent Orange 2, 7, 11, 15, 26, 45, 56;

Solvent Blue 25, 38, 44, 55, 59, 67;

Solvent Red 49;

and derivatives of these dyes.

Other than the above, an azo or xanthene or phthalocyanine acidic dye is also preferable and acidic dyes such as Rhodamine B, Rhodamine 110, and 3-[(5-chloro-2-phenoxyphenyl)hydrazono]-3,4-dihydro-4-oxo-5-[(phenylsulfonyl)amino]-2,7-naphthalenedisulfonic acid and derivatives of these dyes are also preferable.

The photosensitive composition according to the invention most preferably contains an organic-solvent-soluble dye of a di- or higher-valent metal salt (an azo dye metal salt) and an organic-solvent-soluble dye represented by the following formula (II), optionally together with other dyes.

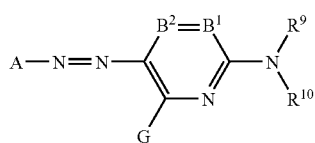

Formula (II)

In the above-mentioned formula (II), A represents an aryl or a 5 to 6-membered aromatic heterocyclic group. Preferable examples of the heteroatom(s) contained in the 5 to 6-membered heterocycle include N, O, and S. The group represented by A is preferably a nitrogen-containing 5-membered heterocycle and the heterocycle may be condensed with an aliphatic ring, an aromatic ring, or other heterocycles.

Preferable examples of the heterocycle of A include a pyridine ring, a pyrimidine ring, a triazole ring, a pyrazole ring, an imidazole ring, a thiazole ring, an isothiazole ring, a thiadiazole ring, a benzothiazole ring, a benzoxazole ring, and a benzoisothiazole ring. The respective heterocycles may have substituent groups. Especially, a pyrazole ring, an imidazole ring, an isothiazole ring, a thiadiazole ring, and a benzothiazole ring represented by the follow general formulas (a) to (f) are preferable.

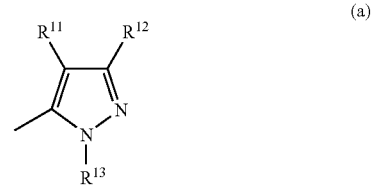

(a)

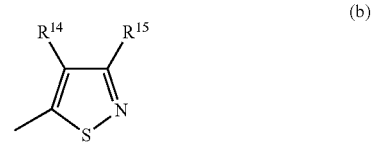

(b)

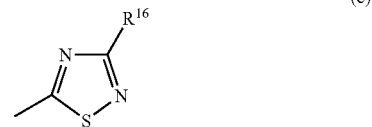

(c)

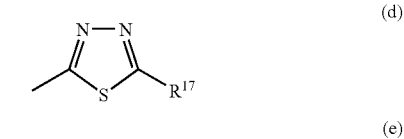

(d)

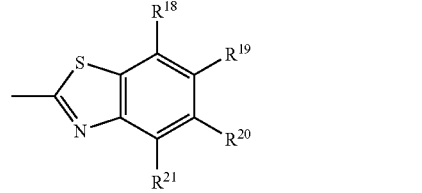

(e)

-continued

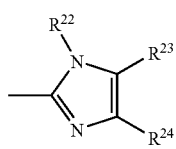

(f)

R¹¹ to R²⁴ in the above general formulas (a) to (f) have the same definition and preferable examples as those of G; R⁵, and R⁶ described below. Preferable heterocycles among those represented by the formulas (a) to (f) are the pyrazole ring and the isothiazole ring represented by the formulas (a) and (b). The pyrazole ring represented by the formula (a) is particularly preferable.

B¹ represents —CR⁵= or a nitrogen atom; B² represents —CR⁶= or a nitrogen atom; and B¹ and B² do not represent nitrogen atoms simultaneously. That is, both represent —CR⁵= and —CR⁶=, respectively or either one of B¹ and B² represents a nitrogen atom and the other represents —CR⁵= or —CR⁶=. In a preferable embodiment, B¹ represents —CR⁵= and B² represents —CR⁶=.

The above-mentioned R⁹ and R¹⁰ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, a sulfamoyl group, a monoalkylsulfamoyl group, or a monoarylsulfamoyl group; the respective groups may have substituent groups. Preferable examples of the groups represented by R⁹ and R¹⁰ include a hydrogen atom, an aliphatic group, an aromatic group, a heterocyclic group, an acyl group, an alkylsulfonyl group, and an arylsulfonyl group, and further preferable examples of the groups include a hydrogen atom, an aromatic group, a heterocyclic group, an acyl group, an alkylsulfonyl group, or an arylsulfonyl group. Furthermore preferable examples of the groups include a hydrogen atom, an aryl group, and a heterocyclic group. In a preferable embodiment, these preferable groups further have substituent groups. R⁹ and R¹⁰ are not hydrogen atoms simultaneously.

The above-mentioned G; R⁵, and R⁶ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclyloxy group, an alkoxycarbonyloxy group, an aryloxycarbonyloxy group, an amino group substituted by an alkyl, aryl, or heterocyclic group, an acylamino group, a ureido group, a sulfamoylamino group, an alkoxycarbonylamino group, an aryloxycarbonylamino group, an alkyl- or aryl-sulfonylamino group, a nitro group, an alkyl- or aryl-thio group, an alkyl- or aryl-sulfonyl group, an alkyl- or aryl-sulfinyl group, a sulfamoyl group, a monoalkylsulfamoyl group, a monoarylsulfamoyl group, a sulfo group, a mercapto group, or a heterocyclylthio group. The respective groups may themselves be substituted.

Preferable examples of the group represented by abovementioned G include a hydrogen atom, a halogen atom, an aliphatic group, an aromatic group, a hydroxy group, an alkoxy group, an aryloxy group, an acyloxy group, a heterocyclyloxy group, an amino group substituted by an alkyl, aryl, or heterocyclic group, an acylamino group, a ureido group, a sulfamoylamino group, an aryloxycarbonylamino group, an aryloxycarbonylamino group, an alkyl- or aryl-thio group, or a heterocyclylthio group. More preferable examples include a hydrogen atom, a halogen atom, an alkyl group, a hydroxy group, an alkoxy group, an aryloxy group, an acyloxy group, an amino group substituted by an alkyl, aryl, or heterocyclic group, and an acylamino group; especially, a hydrogen atom, an arylamino group, and an amido group are furthermore preferable. The respective groups may themselves be substituted.

Preferable examples of the groups represented by R⁵ and R⁶ include a hydrogen atom, an alkyl group, an alkoxycarbonyl group, a carboxyl group, a carbamoyl group, and a cyano group. The respective groups may further have substituent groups.

Also, R⁵ and R⁹ may be bonded to each other to form a 5-membered or 6-membered ring. R⁹ and R¹⁰ may be bonded to each other to form a 5-membered or 6-membered ring.

When the respective groups represented by the abovementioned A, R⁵, R⁶, R⁹, R¹⁰, and G further have substituent groups, examples of the substituent groups include the abovedescribed examples of the substituent groups on G, R⁵, and R⁶.

Hereinafter, the respective groups of the formula will be described in detail.

In this specification, the halogen atom may be a fluorine, chlorine, or bromine atom. The halogen atom is preferably a chlorine or bromine atom. The halogen atom is more preferably a chlorine atom.

In this specification, the scope of the term "aliphatic group" includes alkyl groups, substituted alkyl groups, alkenyl groups, substituted alkenyl groups, alkynyl groups, substituted alkynyl groups, aralkyl groups, and substituted aralkyl groups. The aliphatic group may be branched and may form a ring.

The number of the carbon atoms contained in the aliphatic group is preferably from 1 to 20 and more preferably from 1 to 16. The aryl portion of an aralkyl or substituted aralkyl group is preferably a phenyl group or a naphthyl group, and more preferably a phenyl group. Examples of the aliphatic group include methyl, ethyl, butyl, isopropyl, n-butyl, tert-butyl, n-octyl, hydroxyethyl, methoxyethyl, cyanoethyl, trifluoromethyl, 3-sulfopropyl, 4-sulfobutyl, cyclohexyl, benzyl, 2-phenethyl, vinyl, and aryl groups. Preferable aliphatic groups are methyl, ethyl, isopropyl, n-butyl, tert-butyl, and hydroxyethyl groups. More preferable aliphatic groups are methyl, ethyl, and tert-butyl groups.

In this specification, the scope of the term "aromatic group" includes unsubstituted or substituted aryl groups. The aryl group is preferably a phenyl group or a naphthyl group, and more preferably a phenyl group. The number of the carbon atoms contained in the aryl group is preferably from 6 to 20, and more preferably from 6 to 16. Examples of the aromatic group include a phenyl group, a p-tolyl group, a 1,3,5-trimethylphenyl group, a p-methoxyphenyl group, an o-chlorophenyl group, a m-nitrophenyl group, a p-nitrophenyl group, a p-carboxyl-o-nitrophenyl group, a 2,4-dicarboxylphenyl group, and a m-(3-sulfopropylamino)phenyl group. Preferable aromatic groups are phenyl, p-tolyl, 1,3,5-trimethylphenyl, p-methoxyphenyl, m-nitrophenyl, p-nitrophenyl, p-carboxyl-o-nitrophenyl, and 2,4-dicarboxylphenyl groups. More preferable aromatic groups are phenyl, 1,3,5-trimethylphenyl, p-carboxyl-o-nitrophenyl, and 2,4-dicarboxylphenyl groups.

In this specification, the scope of the term "heterocyclic group" includes substituted heterocyclic groups and unsubstituted heterocyclic groups. Aliphatic rings, aromatic rings, and other heterocyclic rings may be condensed with the heterocyclic group. The heterocyclic group is preferably a 5-membered or 6-membered heterocyclic group. Examples of the substituent groups include an aliphatic group, a halogen atom, an alkyl group, an arylsulfonyl group, an acyl group, an acylamino group, a sulfamoyl group, an N-alkylsulfamoyl group, an N-arylsulfamoyl group, a carbamoyl group, and an ionic hydrophilic group. Preferable examples of the substituent groups are an acyl group, an acylamino group, a sulfamoyl group, a monoalkylsulfamoyl group, and a monoarylsulfamoyl group. More preferable examples of substituent groups are a sulfamoyl group, a monoalkylsulfamoyl group, and a monoarylsulfamoyl group.

Examples of the unsubstituted heterocyclic group include 2-pyridyl, 2-thienyl, 2-thiazolyl, 2-benzothiazolyl, 2-benzoxazolyl, 2-thiadiazolyl, and 2-furyl groups. Preferable examples are 2-thiazolyl, 2-benzothiazolyl, and 2-thiadiazolyl groups, and more preferable examples are 2-benzothiazolyl and 2-thiadiazolyl groups. They preferably have substituent groups.

In this specification, the scope of the term "carbamoyl group" includes substituted carbamoyl groups and unsubstituted carbamoyl groups. Examples of the substituent group include alkyl groups, and specific examples thereof are the same as those of the aliphatic group described above. The carbamoyl group is preferably a carbamoyl group having 1 to 5 carbon atoms. Examples of the carbamoyl group include methylcarbamoyl, ethylcarbamoyl, and dimethylcarbamoyl groups. Preferable examples of the carbamoyl group are methylcarbamoyl and ethylcarbamoyl groups. A furthermore preferable example of the carbamoyl group is a methylcarbamoyl group.

In this specification, the scope of the term "alkoxycarbonyl group" includes substituted alkoxycarbonyl groups and unsubstituted alkoxycarbonyl groups. The alkoxycarbonyl group is preferably an alkoxycarbonyl group having 2 to 12 carbon atoms. Examples of the substituent group include ionic hydrophilic groups. Examples of the alkoxycarbonyl group include methoxycarbonyl, ethoxycarbonyl, and butoxycarbonyl groups. Preferable examples of the alkoxycarbonyl group are methoxycarbonyl and ethoxycarbonyl groups. A furthermore preferable example of the alkoxycarbonyl group is a methoxycarbonyl group.

In this specification, the scope of the term "aryloxycarbonyl group" includes substituted aryloxycarbonyl groups and unsubstituted aryloxycarbonyl groups. The aryloxycarbonyl group is preferably an aryloxycarbonyl group having 7 to 12 carbon atoms. Examples of the substituent group include ionic hydrophilic groups. Examples of the aryloxycarbonyl group include phenoxycarbonyl, p-methoxyphenoxycarbonyl, and p-methylpheoxycarbonyl groups. Preferable examples of the aryloxycarbonyl group are phenoxycarbonyl and p-methoxyphenoxycarbonyl groups. A furthermore preferable example of the alkoxycarbonyl group is a phenoxycarbonyl group.

In this specification, the scope of the term "acyl group" includes substituted acyl groups and unsubstituted acyl groups. The acyl group is preferably an acyl group having 1 to 12 carbon atoms. Examples of the substituent group include ionic hydrophilic groups. Examples of the acyl group include acetyl, benzoyl, and o-hydroxybenzoyl groups. Preferable examples of the acyl group are acetyl and benzoyl groups. A furthermore preferable example of the acyl group is an acetyl group.

In this specification, the scope of the term "alkoxy group" includes substituted alkoxy groups and unsubstituted alkoxy groups. The alkoxy group is preferably an alkoxy group having 1 to 12 carbon atoms. Examples of the substituent group include alkoxy groups, hydroxy groups, and ionic hydrophilic groups. Examples of the alkoxy group include methoxy, ethoxy, isopropoxy, methoxyethoxy, 2-hydroxyethoxy, and 3-carboxypropoxy groups. Preferable examples of the alkoxy group are methoxy, methoxyethoxy, 2-hydroxythoxy, and 3-carboxypropoxy groups. Still more preferable examples of the alkoxy group are 2-hydroxyethoxy and 3-carboxypropoxy groups.

In this specification, the scope of the term "aryloxy group" includes substituted aryloxy groups and unsubstituted aryloxy groups. The aryloxy group is preferably an aryloxy group having 6 to 12 carbon atoms. Examples of the substituent group include alkoxy groups and ionic hydrophilic groups. Examples of the aryloxy group include phenoxy, p-methoxyphenoxy, and o-methoxyphenoxy groups. Preferable examples of the aryloxy group are phenoxy and p-methoxyphenoxy groups. A furthermore preferable example of the aryloxy group is a phenoxy group.

In this specification, the scope of the term "acyloxy group" includes substituted acyloxy groups and unsubstituted acyloxy groups. The acyloxy group is preferably an acyloxy group having 1 to 12 carbon atoms. Examples of the substituent group include ionic hydrophilic groups. Examples of the acyloxy group include acetoxy, benzoyloxy, and o-hydroxybenzoyl groups. Preferable examples of the acyloxy group are acetoxy and benzoyloxy groups. A furthermore preferable example of the acyloxy group is an acetoxy group.

In this specification, the scope of the term "carbamoyloxy group" includes substituted carbamoyloxy groups and unsubstituted carbamoyloxy groups. Examples of the substituent group include alkyl groups. The carbamoyloxy group is preferably a carbamoyloxy group having 1 to 6 carbon atoms. Examples of the carbamoyloxy group include N-methylcarbamoyloxy, N-ethylcarbamoyloxy, and N-n-butylcarbamoyloxy groups. Preferable examples of the carbamoyloxy group are N-methylcarbamoyloxy and N-ethylcarbamoyloxy groups. A furthermore preferable example of the carbamoyloxy group is a N-methylcarbamoyloxy group.

In this specification, the scope of the term "heterocyclyloxy group" includes substituted heterocyclyloxy groups and unsubstituted heterocyclyloxy groups. The heterocycle is preferably a 5-membered or 6-membered heterocycle, and the heterocycle may be condensed with an aliphatic ring, an aromatic ring, or other heterocycles. Examples of the substituent group are the same as in the description of the substituent groups on the heterocyclic group described above, and preferable groups are also the same. Examples of the unsubstituted heterocyclyloxy group include 3-isooxazolyloxy group, 2-benzthiazolyloxy group, and 2-pyridyloxy group groups.

In this specification, the scope of the term "alkoxycarbonyloxy group" includes substituted alkoxycarbonyloxy groups and unsubstituted alkoxycarbonyloxy groups. The alkoxycarbonyloxy group is preferably an alkoxycarbonyloxy group having 1 to 5 carbon atoms. Examples of the substituent group include ionic hydrophilic groups. Examples of the alkoxycarbonyloxy group include methoxycarbonyloxy, ethoxycarbonyloxy, and propoxycarbonyloxy groups. A particularly preferable example of the alkoxycarbonyloxy group is a methoxycarbonyloxy group.

In this specification, the scope of the term "aryloxycarbonyloxy group" includes substituted aryloxycarbonyloxy groups and unsubstituted aryloxycarbonyloxy groups. The aryloxycarbonyloxy group is preferably an aryloxycarbonyloxy group having 6 to 15 carbon atoms. Examples of the substituent group include ionic hydrophilic groups. Examples of the aryloxycarbonyloxy group include phenoxycarbonyloxy, p-methoxyphenoxycarbonyloxy, and p-tolylphenoxycarbonyloxy groups. A particularly preferable example of the aryloxycarbonyloxy group is a phenoxycarbonyloxy group.

In this specification, "the amino group substituted by an alkyl, aryl, or heterocyclic group" may further have a substituent group. Unsubstituted amino groups are not included. The alkylamino group is preferably an alkylamino group having 1 to 6 carbon atoms. When the amino group further has a substituent group, examples of the substituent group include ionic hydrophilic groups. Examples of the alkylamino group include methylamino, diethylamino, bis(2-hydroxyethyl)amino, bis(carboxymethyl)amino, 2-(1,3-dihydroxypropyl)amino, 2-(1,3-dihydroxy-2-methylpropyl)amino, 2-(hydroxypropyl-2-methyl)amino, 2,3-dihydroxypropylamino, and 2-hydroxypropylamino groups. Preferable examples of the alkylamino group are methylamino, bis(2-hydroxyethyl)amino, bis(carboxymethyl)amino, 2-(1,3-dihydroxypropyl)amino, 2,3-dihydroxypropylamino, and 2-hydroxypropylamino groups. More preferable examples of the alkylamino group are bis(carboxymethyl)amino, 2-(1,3-dihydroxypropyl)amino, and 2-hydroxypropylamino groups.

In this specification, the scope of the term "arylamino group" includes substituted arylamino groups and unsubstituted arylamino groups. The arylamino group is preferably an arylamino group having 6 to 12 carbon atoms. When the arylamino group has a substituent group, examples of the substituent group include halogen atoms and ionic hydrophilic groups. Examples of the arylamino group include an anilino group, a 1,3,5-trimethylanilino group, a p-methoxyanilino group, a 2-chloroanilino group, a m-carboxylanilino group, and a 2,4-dicarboxylanilino group. Preferable examples of the arylamino group are an anilino group, a 1,3,5-trimethylanilino group, a m-carboxylanilino group, and a 2,4-dicarboxylanilino group. More preferable examples of the arylamino group are a 1,3,5-trimethylanilino group and a 2,4-dicarboxylanilino group.

In this specification, the scope of the term "acylamino group" includes substituted acylamino groups and unsubstituted acylamino groups. The acylamino group is preferably an acylamino group having 2 to 12 carbon atoms. Examples of the substituent group include ionic hydrophilic groups. Examples of the acylamino group include an acetylamino group, a propionylamino group, a benzoylamino group, a N-phenylacetylamino group, and a 3,5-disulfobenzoylamino group. Preferable examples of the acylamino group are an acetylamino group, a propionylamino group, a benzoylamino group, and a N-phenylacetylamino group. More preferable examples of the acylamino group are an acetylamino group and a benzoylamino group.

In this specification, the scope of the term "ureido group" includes substituted ureido groups and unsubstituted ureido groups. The ureido group is preferably a ureido group having 1 to 12 carbon atoms. Examples of the substituent group include an alkyl group and an aryl group. Examples of the ureido group include a 3-methylureido group, a 3,3-dimethylureido group, and a 3-phenylureido group. Preferable examples of the ureido group are a 3-methylureido group and a 3-phenylureido group. A particularly preferable example of the ureido group is a 3-methylureido group.

In this specification, the scope of the term "sulfamoylamino group" includes substituted sulfamoylamino groups and unsubstituted sulfamoylamino groups. Examples of the substituent group include alkyl groups. Examples of the sulfamoylamino group include a sulfamoylamino group, a 1,3-dihydroxypropylsulfamoylamino group, a N,N-dipropylsulfamoylamino group, and a N,N-dipropionic acid sulfamonylamino group. Preferable examples of the sulfamoylamino group are a sulfamoylamino group, a 1,3-dihydroxypropylsulfamoylamino group, and a N,N-dipropionic acid sulfamoylamino group. More preferable examples of the sulfamoylamino group are a 1,3-dihydroxypropylsulfamoylamino group and a N,N-dipropionic acid sulfamonylamino group.

In this specification, the scope of the term "alkoxycarbonylamino group" includes substituted alkoxycarbonylamino groups and unsubstituted alkoxycarbonylamino groups. The alkoxycarbonylamino group is preferably an alkoxycarbonylamino group having 2 to 12 carbon atoms. Examples of the substituent group include ionic hydrophilic groups. Examples of the alkoxycarbonylamino group include an ethoxycarbonylamino group, a propoxycarbonylamino group, and a butyloxycarbonylamino group. Preferable examples of the alkoxycarbonylamino group are an ethoxycarbonylamino group and a propoxycarbonylamino group. A particularly preferable example of the alkoxycarbonylamino group is an ethoxycarbonylamino group.

In this specification, the scope of the term "aryloxycarbonylamino group" includes substituted aryloxycarbonylamino groups and unsubstituted aryloxycarbonylamino groups. The aryloxycarbonylamino group is preferably an aryloxycarbonylamino group having 7 to 12 carbon atoms. Examples of the substituent group include ionic hydrophilic groups. Examples of the aryloxycarbonylamino group include a phenoxycarbonylamino group, a p-methylphenoxycarbonylamino group, and an o-hydroxyphenoxycarbonylamino group. Preferable examples of the aryloxycarbonylamino group are a phenoxycarbonylamino group and an o-hydroxyphenoxycarbonylamino group. A particularly preferable example of the aryloxycarbonylamino group is an o-hydroxyphenoxycarbonylamino group.

In this specification, the scope of an alkoxysulfonylamino group and an arylsulfonylamino group (alkyl/arylsulfonylamino group) includes substituted alkyl/arylsulfonylamino groups and unsubstituted alkyl/arylsulfonylamino groups. The alkyl/arylsulfonylamino group is preferably an alkyl/arylsulfonylamino group having 1 to 12 carbon atoms. Examples of the substituent group include ionic hydrophilic groups. Examples of the alkyl/arylsulfonylamino group include a methanesulfonylamino group, a N-phenylmethanesulfonylamino group, a benzenesulfonylamino group, and a 3-carboxybenzenesulfonylamino group. Preferable examples of the alkyl/arylsulfonylamino group are a methanesulfonylamino group and a 3-carboxybenzenesulfonylamino group. A particularly preferable example of the alkyl/arylsulfonylamino group is a 3-carboxybenzenesulfonylamino group.

In this specification, the scope of an alkylthio group, an arylthio group, and a heterocyclylthio group includes substituted alkylthio, arylthio, and heterocyclylthio groups and unsubstituted alkylthio, arylthio, and heterocyclylthio groups. The alkylthio, arylthio, and heterocyclylthio groups are preferably those having 1 to 12 carbon atoms. Examples of the substituent group include ionic hydrophilic groups. Examples of the alkylthio, arylthio, and heterocyclylthio groups include methylthio, phenylthio, and 2-pyridylthio groups.

In this specification, examples of the alkylsulfonyl and aryl sulfonyl groups include methanesulfonyl and phenylsulfonyl, respectively.

Examples of the alkylsulfinyl and arylsulfinyl groups include methanesulfinyl and phenylsulfinyl, respectively.

In this specification, the scope of the term "sulfamoyl group" includes substituted sulfamoyl groups and unsubstituted sulfamoyl groups. Examples of the substituent group include alkyl groups and aryl groups. Examples of the sulfamoyl group include unsubstituted sulfamoyl, dimethylsulfamoyl, bis(carboxymethyl)sulfamoyl, di(2-hydroxyethyl)sulfamoyl, 2,4-dicarboxylphenylsulfamoyl, 2-(1,3-dihydroxypropyl)sulfamoyl, 2-(hydroxypropyl)sulfamoyl, 2-(hydroxy-2-methylpropyl)sulfamoyl, 2-(1,3-dihydroxy-2-methylpropyl)sulfamoyl, and dipropionic acid sulfamoyl groups. Preferable examples of the sulfamoyl group are unsubstituted sulfamoyl, bis(carboxymethyl)sulfamoyl, di(2-hydroxyethyl)sulfamoyl, 2,4-dicarboxylphenylsulfamoyl, 2-(1,3-dihydroxypropyl)sulfamoyl, and dipropionic acid sulfamoyl groups. More preferable examples of the sulfamoyl group are bis(carboxymethyl)sulfamoyl, di(2-hydroxyethyl)sulfamoyl, and 2-(1,3-dihydroxypropyl)sulfamoyl groups.

Particularly preferable azo dyes are those represented by the following formula (III).

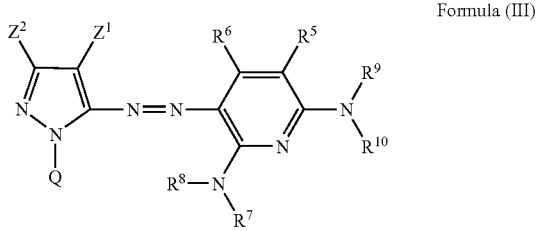

Formula (III)

In the above-mentioned formula (III), $Z^1$ represents an electron attractive group having a Hammett's substituent constant value $\sigma_p$ of 0.20 or higher, and preferably an electron attractive group having a Hammett's substituent constant value $\sigma_p$ of 0.30 to 1.0. Specific examples of preferable groups include the after-mentioned electron attractive substituent groups, particularly an acyl group having 2 to 12 carbon atoms, an alkyloxycarbonyl group having 2 to 12 carbon atoms, a nitro group, a cyano group, an alkylsulfonyl group having 1 to 12 carbon atoms, an arylsulfonyl group having 6 to 18 carbon atoms, a carbamoyl group having 1 to 12 carbon atoms, and a haloalkyl group having 1 to 12 carbon atoms. More preferable examples are a cyano group, an alkylsulfonyl group having 1 to 12 carbon atoms, and an arylsulfonyl group having 6 to 18 carbon atoms, and still more preferable example is a cyano group.

In the above-mentioned formula (III), $Z^2$ represents a hydrogen atom, an aliphatic group, an aromatic group, or a heterocyclic group. Details of the aliphatic group, the aromatic group, or the heterocyclic group are as described above.

In the above-mentioned formula (III), $R^5$, $R^6$, $R^9$, and $R^{10}$ have the same definitions as $R^5$, $R^6$, $R^9$, and $R^{10}$ in the above-mentioned formula (II), and preferable examples thereof are also the same.

In the above-mentioned formula (III), $R^7$ and $R^8$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group. Preferable groups among them are a hydrogen atom, an aromatic group, a heterocyclic group, an acyl group, an alkylsulfonyl group, and an arylsulfonyl group. More preferable groups are a hydrogen atom, an aromatic group, and a heterocyclic group. Details of the respective groups are as described above.

In the above-mentioned formula (III), Q represents a hydrogen atom, an aliphatic group, an aromatic group, or a heterocyclic group. In particular, Q is preferably a group composed of non-metallic atoms necessary for forming a 5- to 8-membered ring. The 5- to 8-membered ring may be substituted, and may be saturated or may have an unsaturated bond. The ring is more preferably a 5- to 8-membered aromatic cyclic group or heterocyclic group. Preferable non-metallic atoms include nitrogen atom, oxygen atom, sulfur atom, and carbon atom. Specific examples of the 5- to 8-membered ring include a benzene ring, a cyclopentane ring, a cyclohexane ring, a cycloheptane ring, a cyclooctane ring, a cyclohexene ring, a pyridine ring, a pyrimidine ring, a pyrazine ring, a pyridazine ring, a triazine ring, an imidazole ring, a benzimidazole ring, an oxazole ring, a benzoxazole ring, a thiazole ring, a benzothiazole ring, an oxane ring, a sulfolane ring, and a thiane ring.

The respective groups in the general formula (III) may themselves have a substituent group. When these groups further have a substituent group, examples of the substituent group include the substituent groups mentioned in the description of formula (II), the above-mentioned examples of the groups represented by G, $R^5$, and $R^6$, and ionic hydroxyl groups.

Next, in connection to the substituent group $Z^1$, the Hammett's substituent constant value $\sigma_p$ referred to in this specification will be described.

The Hammett's rule is an expirical rule proposed by L. P. Hammett on 1935 for quantitatively discussing the effects of a substituent group on reaction or equilibrium of a benzene derivative. Its propriety has been widely confirmed. The substituent constant according to the Hammett's rule include $\sigma_p$ value and $\sigma_m$ value and these values can be found in a lot of general publications and are described in detail in, for example, J. A. Dean, "Lange's and book of Chemistry", 12 edition (1979), McGraw-Hill; "Kagaku no Ryoiki (Sphere of Chemistry)", Special edition, vol. 122, pp. 96-103 (1979), Nanko Do. In the invention although the respective substituent groups are limited or explained on the basis of the Hammett's substituent constant value $\sigma_p$, it means that the substituent groups may include not only the substituent groups whose Hammett's substituent constant values $\sigma_p$ are already known in publications and documents but also groups whose Hammett's substituent constant values $\sigma_p$ are not reported in publications but are to be found to be within the designated range when their Hammett's substituent constant values are measured based on the Hammett's rule. The compounds represented by the general formulas (II) and (III) include those which are not benzene derivatives, and the $\sigma_p$ value is used as an indicator of the electronic effect of substituent groups regardless of the substitution positions. In this invention, the $\sigma_p$ value is used in this meaning.

Examples of electron attractive groups having a Hammett's substituent constant value $\sigma_p$ of 0.60 or higher include a cyano group, a nitro group, an alkylsulfonyl group (e.g. a methanesulfonyl group), and an arylsulfonyl group (e.g. a benzenesulfonyl group).

Examples of electron attractive groups having a Hammett's substituent constant value $\sigma_p$ of 0.45 or higher include, in addition to the above-exemplified groups, an acyl group (e.g. an acetyl group), an alkoxycarbonyl group (e.g. a dodecyloxycarbonyl group), an aryloxycarbonyl group (e.g. a m-chlorophenoxycarbonyl group), an alkylsulfinyl group (e.g. a n-propylsulfinyl group), an arylsulfinyl group (e.g. a phenylsulfinyl group), a sulfamoyl group (e.g. a N-ethylsulfamoyl group and a N,N-dimethylsulfamoyl group), and a haloalkyl group (e.g. a trifluoromethyl group).

Examples of electron attractive groups having a Hammett's substituent constant value $\sigma_p$ of 0.30 or higher include, in addition to the above-exemplified groups, an acyloxy group (e.g. an acetoxy group), a carbamoyl group (e.g. a N-ethylcarbamoyl group and a N,N-dibutylcarbamoyl group), a haloalkoxy group (e.g. a trifluoromethyloxy group), a haloaryloxy group (e.g. a pentafluorophenyloxy group), a sulfonyloxy (e.g. a methylsulfonyloxy group), a haloalkylthio group (e.g. a difluoromethylthio group), an aryl group substituted by two or more electron attractive groups each having $\sigma_p$ of 0.15 or higher (e.g., a 2,4-dinitrophenyl group and a pentachlorophenyl group), and a heterocyclic group (e.g. a 2-benzoxazolyl group, a 2-benzothiazolyl group, and a 1-phenyl-2-benzimidazolyl group). Specific examples of electron attractive groups having a Hammett's substituent constant value $\sigma_p$ of 0.20 or higher include, in addition to the above-exemplified groups, halogen atoms.

Preferable combinations as azo dyes represented by the above-mentioned formula (II) are the following conditions (A) to (D).

(A) $R^9$ and $R^{10}$ each independently represent preferably a hydrogen atom, an alkyl group, an aryl group, a heterocyclic group, an alkylsulfonyl group, an arylsulfonyl group, or an acyl group; more preferably a hydrogen atom, an alkyl group, an aryl group, a heterocyclic group, an alkylsulfonyl group, or an arylsulfonyl group; and still more preferably a hydrogen atom, an alkyl group, an aryl group, or a heterocyclic group, provided $R^9$ and $R^{10}$ are not hydrogen atoms simultaneously.

(B) G represents preferably a hydrogen atom, a halogen atom, an alkyl group, a hydroxy group group, an amino group substituted by an alkyl, aryl, or heterocyclic group, or an amido group; more preferably a hydrogen atom, a halogen atom, an amino group substituted by an alkyl, aryl, or heterocyclic group, or an amido group; and still more preferably a hydrogen atom, an amino group substituted by an alkyl, aryl, or heterocyclic group, or an amido group.

(C) A represents preferably a pyrazole ring, an imidazole ring, an isothiazole ring, a thiazole ring, or a benzothiazole ring; more preferably a pyrazole ring or an isothiazole ring; and furthermore preferably a pyrazole ring.

(D) $B^1$, $B^2$ each independently represent —$CR^5$= and —$CR^6$=, respectively; and $R^5$ and $R^6$ each independently represent preferably a hydrogen atom, a halogen atom, a cyano group, a carbamoyl group, a carboxyl group, an alkyl group, a hydroxy group, or an alkoxy group and preferably a hydrogen atom, a cyano group, a carbamoyl group, or an alkyl group.

In preferable embodiments of the compound represented by the general formula (II), at least one of the conditions (A) to (D) is satisfied. If more conditions selected from conditions (A) to (D) are satisfied, the compounds are more preferable. In a still more preferable embodiment, all of conditions (A) to (D) are satisfied.

Preferable specific examples [exemplary compounds (1) to (24)] of the organic-solvent-soluble dye represented by the above-mentioned formula (II) or the above-mentioned formula (III) are shown below. However, the examples should not be construed as limiting the invention.

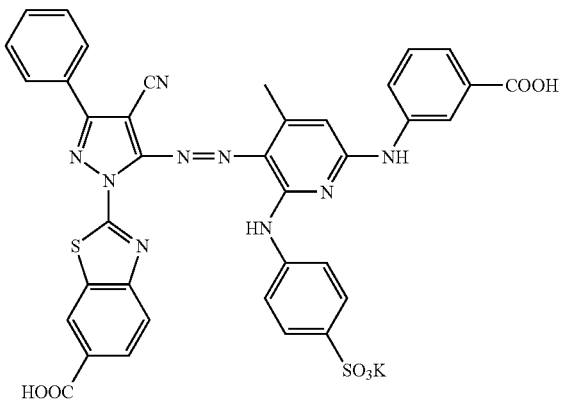

(1)

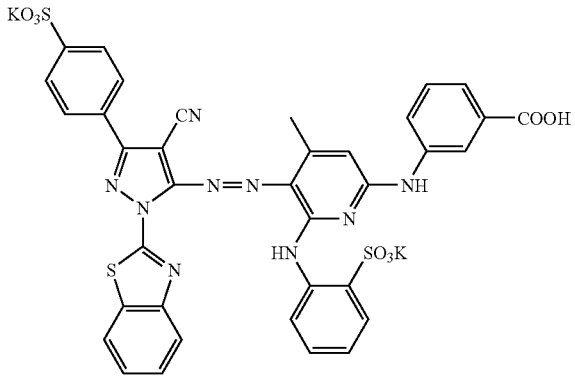

(2)

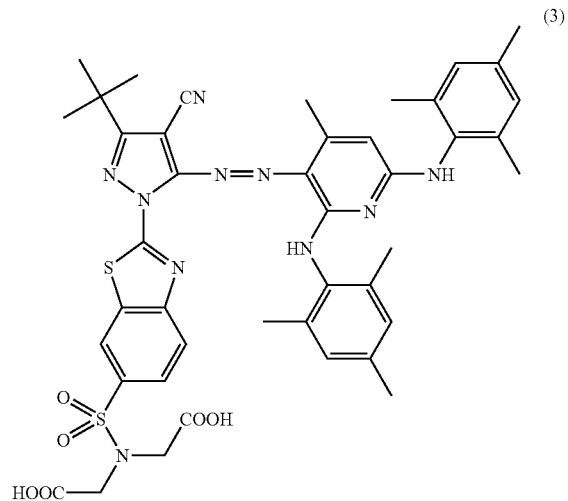

(3)

-continued
(4)
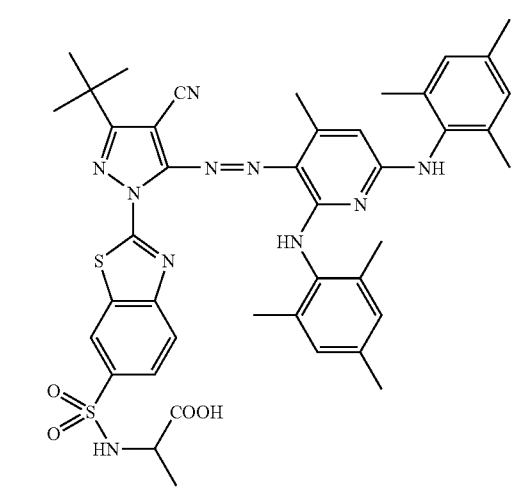
(5)
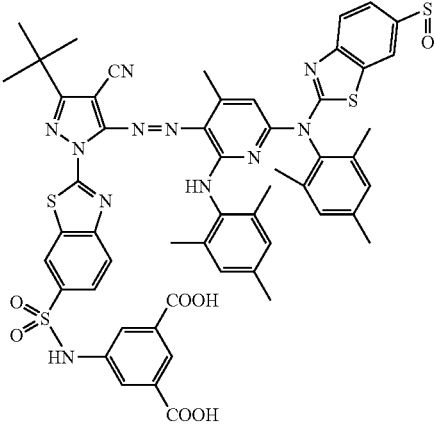
(6)
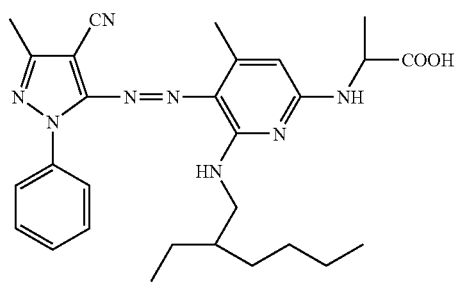
(7)
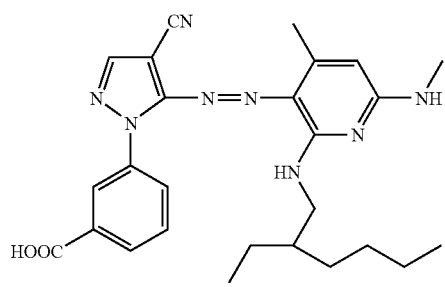
-continued
(8)
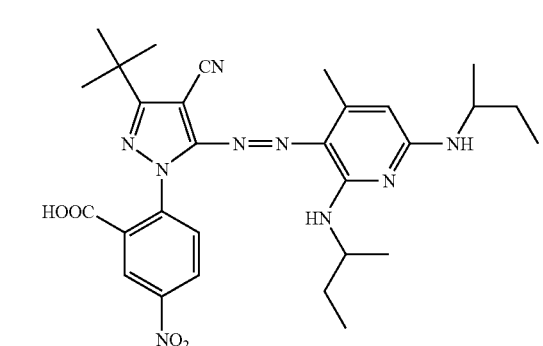
(9)
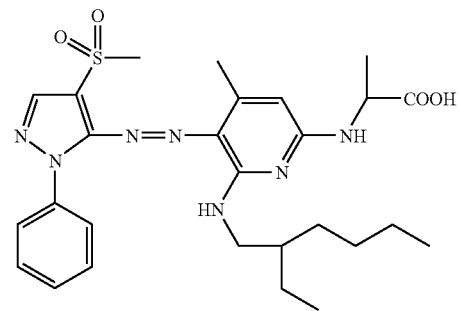
(10)
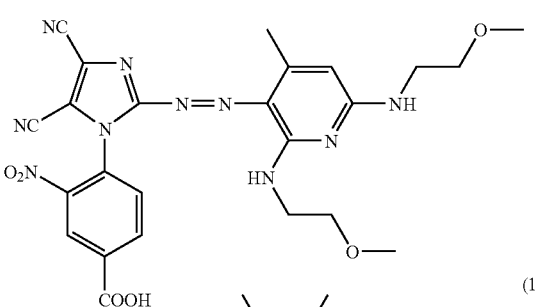
(11)
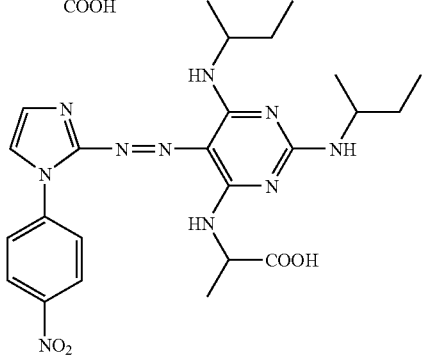
(12)
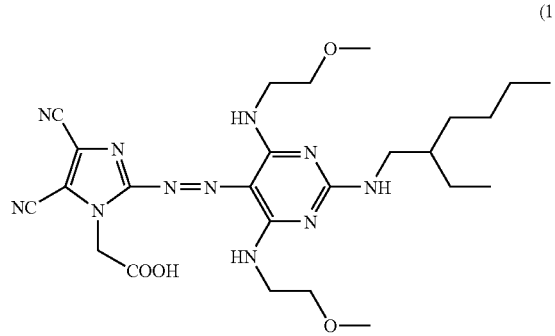

-continued
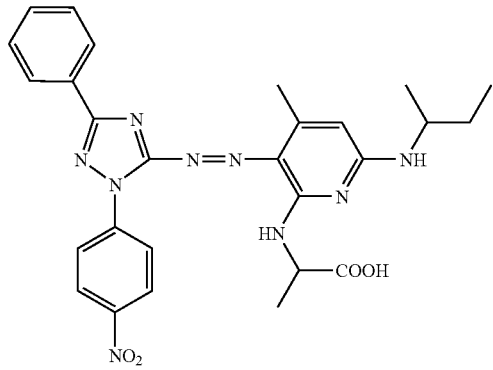
(13)
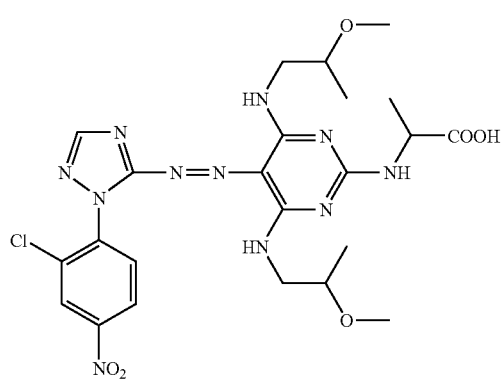
(14)
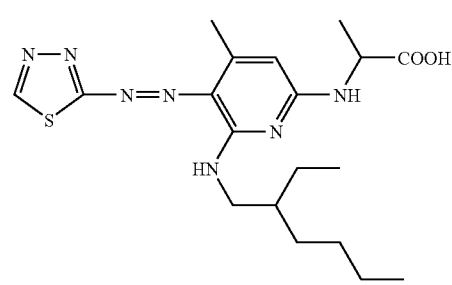
(15)
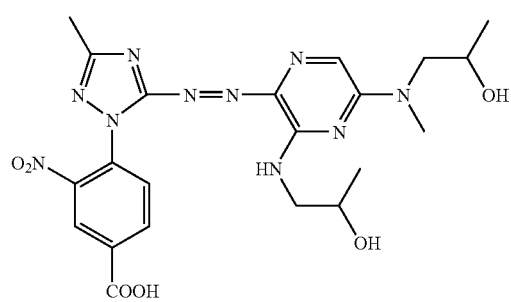
(16)
-continued
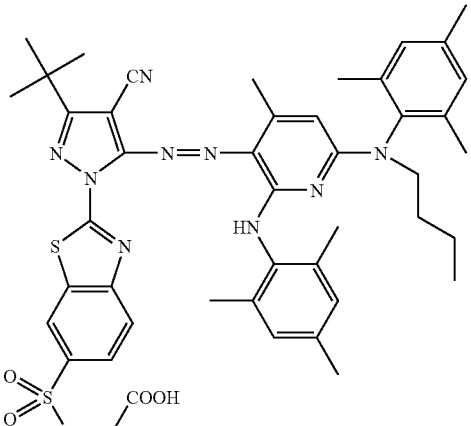
(17)
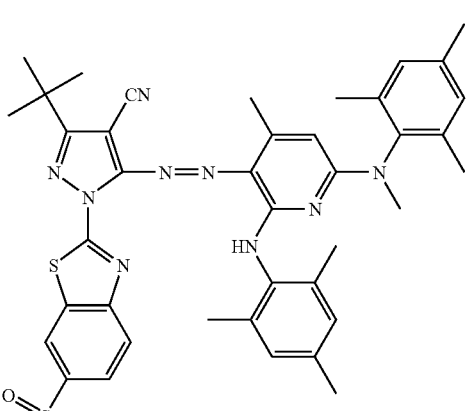
(18)
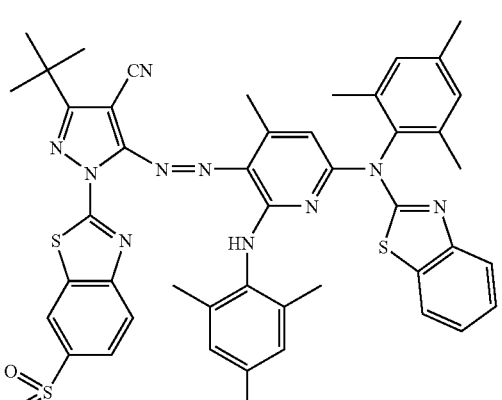
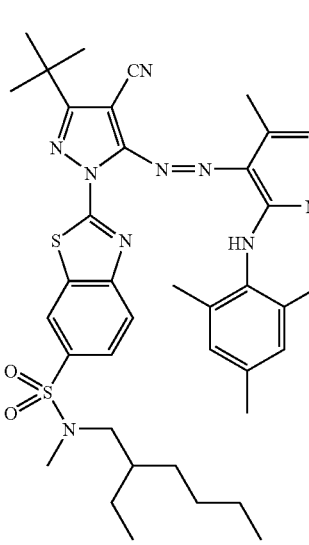
(19)

(20)
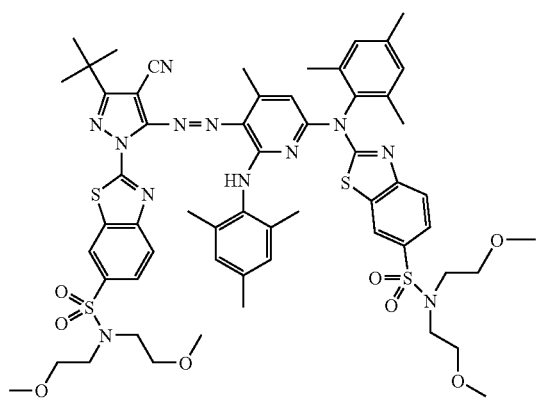

(21)
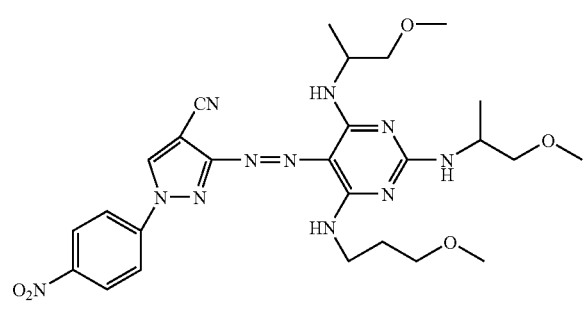

(22)
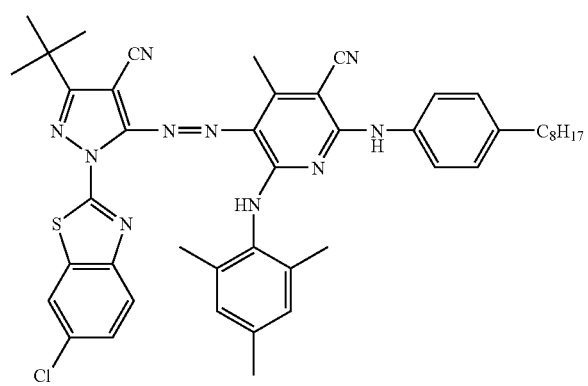

(23)
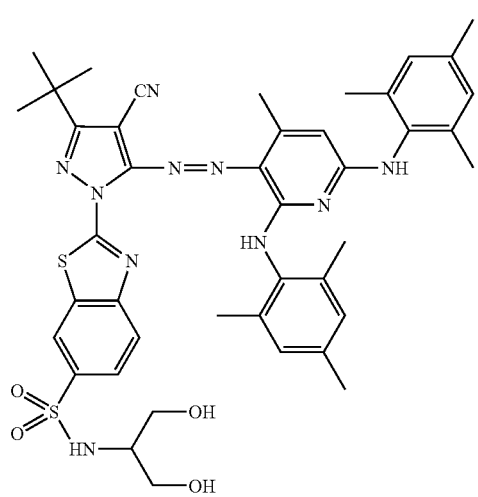

(24)
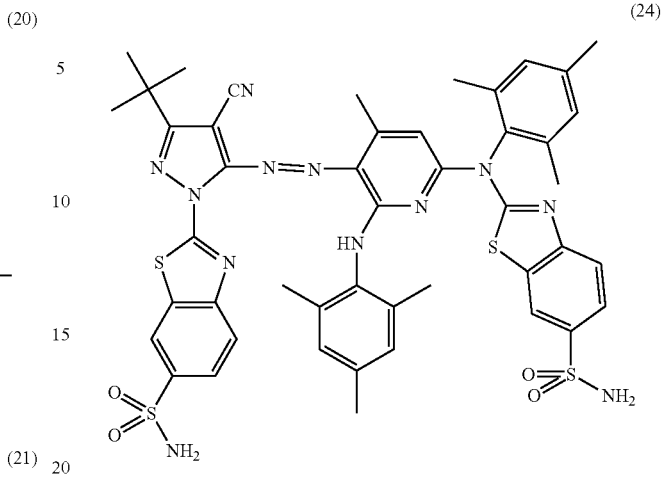

When the organic-solvent-soluble dye represented by the above-mentioned formula (II) or the above-mentioned formula (III) is used in combination with the above described azo dye metal salt according to the invention (including the azo dye metal salt represented by the above-mentioned formula (I)), the ratio of the azo dye metal salt to the organic-solvent-soluble dye represented by the formula (II) or (III) [azo dye metal salt: dye of (II) and/or (III)] is preferably in the range of 1:5 to 5:1 and more preferably 3:7 to 7:3.

—Radiation Sensitive Compound—

It is preferable for the photosensitive composition according to the invention to contain at least one radiation sensitive compound. The radiation sensitive compound is a compound which causes chemical reaction to generate radical, acid, or base upon irradiation with radiation such as UV, Deep UV, visible light, infrared rays, and electron beams. The radiation sensitive compound is used for insolubilizing the above-mentioned alkali soluble resin by crosslinking, polymerization, or decomposition of an acidic group, or for insolubilizing the film against alkali developer solution by polymerizing a polymerizable monomer or oligomer coexisting in the film or by crosslinking with a crosslinking agent. A photopolymerization initiator or a photo-acid generator is especially preferable.

Hereinafter, a photopolymerization initiator and a photo-acid generator preferable in the invention will be described.

—Photopolymerization Initiator—

The photopolymerization initiator is not particularly limited as long as it is capable of polymerizing a monomer having a polymerizability (a polymerizable monomer) and is preferably selected in terms of properties, initiating efficiency, absorption wavelength, availability, and cost.

Examples of the above-mentioned photopolymerization initiator include at least one active halogen compound selected from halomethyloxadiazole compounds and halomethyl-s-triazine type compounds, 3-aryl-substituted cumarin compound, lophine dimer, a benzophenone compound, an acetophenone compound and its derivatives, a cyclopentadiene-benzene-iron complex and its salts, and an oxime type compound.

Examples of the halomethyloxadiazole compound as an active halogen compound include 2-halomethyl-5-vinyl-1,3,4-oxadiazole compound, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole as described in Japanese Patent Publication (JP-B) No. 57-6096.

Examples of the halomethyl-s-triazine compound as a photopolymerization initiator include vinyl-halomethyl-s-triazine compounds described in JP-B No. 59-1281, 2-(naphtho-1-yl)-4,6-bis-halomethyl-s-triazine compounds and 4-(p-aminophenyl)-2,6-di-halomethyl-s-triazine compounds described in JP-A 53-133428.

Other specific examples of the photopolymerization initiator include
2,4-bis(trichloromethyl)-6-p-methoxystyryl-s-triazine,
2,6-bis(trichloromethyl)-4-(3,4-methylenedioxyphenyl)-1,3,5-triazine,
2,6-bis(trichloromethyl)-4-(4-methyoxyphenyl)-1,3,5-triazine,
2,4-bis(trichloromethyl)-6-(1-p-dimethylaminophenyl-1,3-butadienyl)-s-triazine,
2-trichloromethyl-4-amino-6-p-methoxystyryl-s-triazine,
2-(naphtho-1-yl)-4,6-bis(trichloromethyl)-s-triazine,
2-(4-methoxy-naphtho-1-yl)-4,6-bis(trichloromethyl)-s-triazine,
2-(4-ethoxy-naphtho-1-yl)-4,6-bis(trichloromethyl-s-triazine,
2-(4-butoxy-naphtho-1-yl)-4,6-bis(trichloromethyl)-s-triazine,
2-[4-(2-methoxyethyl)-naphtho-1-yl]-4,6-bis(trichloromethyl)-s-triazine,
2-[4-(2-ethoxyethyl)-naphtho-1-yl]-4,6-bis(trichloromethyl)-s-triazine,
2-[4-(2-butoxyethyl)-naphtho-1-yl]-4,6-bis(trichloromethyl)-s-triazine,
2-(2-methoxynaphtho-1-yl]-4,6-bis(trichloromethyl)-s-triazine,
2-(6-methoxy-5-methyl-naphtho-2-yl]-4,6-bis(trichloromethyl)-s-triazine,
2-(6-methoxynaphtho-2-yl]-4,6-bis(trichloromethyl)-s-triazine,
2-(5-methoxynaphtho-1-yl)-4,6-bis(trichloromethyl)-s-triazine,
2-(4,7-dimethoxy-naphtho-1-yl]-4,6-bis(trichloromethyl)-s-triazine,
2-(6-ethoxynaphtho-2-yl]-4,6-bis(trichloromethyl)-s-triazine,
2-(4,5-dimethoxy-naphtho-1-yl]-4,6-bis(trichloromethyl)-s-triazine,
4-[p-N,N-di(ethoxycarbonylmethyl)aminophenyl]-2,6-di(trichloromethyl)-s-triazine,
4-[o-methyl-p-N,N-di(ethoxycarbonylmethyl)aminophenyl]-2,6-di(trichloromethyl)-s-triazine,
4-[p-N,N-di(chloroethyl)aminophenyl]-2,6-di(trichloromethyl)-s-triazine,
4-[o-methyl-p-N,N-di(chloroethyl)aminophenyl]-2,6-di(trichloromethyl)-s-triazine,
4-(p-N-chloroethylaminophenyl)-2,6-di(trichloromethyl)-s-triazine,
4-(p-N-ethoxycarbonylmethylaminophenyl)-2,6-di(trichloromethyl)-s-triazine,
4-[p-N,N-di(phenyl)aminophenyl]-2,6-di(trichloromethyl)-s-triazine,
4-(p-N-chloroethylcarbonylaminophenyl)-2,6-di(trichloromethyl)-s-triazine,
4-[p-N-(p-methoxyphenyl)carbonylaminophenyl]-2,6-di(trichloromethyl)-s-triazine,
4-[m-N,N-di(ethoxycarbonylmethyl)aminophenyl]-2,6-di(trichloromethyl)-s-triazine,
4-[m-bromo-p-N,N-di(ethoxycarbonylmethyl)aminophenyl]-2,6-di(trichloromethyl)-s-triazine,
4-[m-chloro-p-N,N-di(ethoxycarbonylmethyl)aminophenyl]-2,6-di(trichloromethyl)-s-triazine,
4-[m-fluoro-p-N,N-di(ethoxycarbonylmethyl)aminophenyl]-2,6-di(trichloromethyl)-s-triazine,
4-[o-bromo-p-N,N-di(ethoxycarbonylmethyl)aminophenyl]-2,6-di(trichloromethyl)-s-triazine,
4-[o-chloro-p-N,N-di(ethoxycarbonylmethyl)aminophenyl]-2,6-di(trichloromethyl)-s-triazine,
4-[o-fluoro-p-N,N-di(ethoxycarbonylmethyl)aminophenyl]-2,6-di(trichloromethyl)-s-triazine,
4-[o-bromo-p-N,N-di(chloroethyl)aminophenyl]-2,6-di(trichloromethyl)-s-triazine,
4-[o-chloro-p-N,N-di(chloroethyl)aminophenyl]-2,6-di(trichloromethyl)-s-triazine,
4-[o-fluoro-p-N,N-di(chloroethyl)aminophenyl]-2,6-di(trichloromethyl)-s-triazine,
4-[m-bromo-p-N,N-di(chloroethyl)aminophenyl]-2,6-di(trichloromethyl)-s-triazine,
4-[m-chloro-p-N,N-di(chloroethyl)aminophenyl]-2,6-di(trichloromethyl)-s-triazine,
4-[m-fluoro-p-N,N-di(chloroethyl)aminophenyl]-2,6-di(trichloromethyl)-s-triazine,
4-(m-bromo-p-N-ethoxycarbonylmethylaminophenyl)-2,6-di(trichloromethyl)-s-triazine,
4-(m-chloro-p-N-ethoxycarbonylmethylaminophenyl)-2,6-di(trichloromethyl)-s-triazine,
4-(m-fluoro-p-N-ethoxycarbonylmethylaminophenyl)-2,6-di(trichloromethyl)-s-triazine,
4-(o-bromo-p-N-ethoxycarbonylmethylaminophenyl)-2,6-di(trichloromethyl)-s-triazine,
4-(o-chloro-p-N-ethoxycarbonylmethylaminophenyl)-2,6-di(trichloromethyl)-s-triazine,
4-(o-fluoro-p-N-ethoxycarbonylmethylaminophenyl)-2,6-di(trichloromethyl)-s-triazine,
4-(m-bromo-p-N-chloroethylaminophenyl)-2,6-di(trichloromethyl)-s-triazine,
4-(m-chloro-p-N-chloroethylaminophenyl)-2,6-di(trichloromethyl)-s-triazine,
4-(m-fluoro-p-N-chloroethylaminophenyl)-2,6-di(trichloromethyl)-s-triazine,
4-(o-bromo-p-N-chloroethylaminophenyl)-2,6-di(trichloromethyl)-s-triazine,
4-(o-chloro-p-N-chloroethylaminophenyl)-2,6-di(trichloromethyl)-s-triazine, and
4-(o-fluoro-p-N-chloroethylaminophenyl)-2,6-di(trichloromethyl)-s-triazine, Other usable initiators include TAZ series manufactured by Midori Kagaku Co., Ltd. (e.g. TAZ-107, TAZ-110, TAZ-104, TAZ-109, TAZ-140, TAZ-204, TAZ-113, TAZ-123), T-series manufactured by PANCHIM (e.g. T-OMS, T-BMP, T-R, and T-B), IRGACURE series manufactured by Ciba Speciality Chemicals Inc. (e.g. IRGACURE 651, IRGACURE 184, IRGACURE 500, IRGACURE 1000, IRGACURE 149, IRGACURE 819, IRGACURE 261), DAROCURE series (e.g. DAROCURE 1173) manufactured by Ciba Speciality Chemicals Inc., 4,4'-bis(diethylamino)-benzophenone, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4- dimethoxyphenyl)-4,5-diphenylimidazolyl dimer, 2-(p-methylmercaptophenyl)-4,5-diphenylimidazolyl dimer, and benzoin isopropyl ether.

Among the above-mentioned initiators, oxime type compounds are preferable, and still more preferable initiators are
2-(o-benzoyloxime)-1-[4-(phenylthio)phenyl]-1,2-octandione and
1-(o-acetyloxime)-1-[9-ethyl-6-(2-methylbenzoyl)-9H-carbazol-3-yl]ethanone.

Conventionally known photopolymerization initiators other than the above-exemplified photopolymerization initiators can be used in the photosensitive composition according to the invention. Specific examples thereof include vic-polyketol aldonyl compounds described in U.S. Pat. No. 2,367,660; α-carbonyl compounds described in U.S. Pat. Nos. 2,367,661 and 2,367,670; acyloin ethers described in U.S. Pat. No. 2,448,828; α-hydrocarbon-substituted aromatic acyloin compounds described in U.S. Pat. No. 2,722,512; polynuclear quinone compounds described in U.S. Pat. Nos. 3,046,127 and 2,951,758; triallylimidazole dimer/p-aminophenyl ketone combinations described in U.S. Pat. No. 3,549,367; and benzothiazole type compound/trihalomethyl-s-triazine type compounds described in JP-A No. 51-48516.

The content of the above-mentioned photopolymerization initiator in the photosensitive composition is preferably 1.0 to 40.0% by weight, more preferably 2.5 to 30.0% by weight, and still more preferably 5.0 to 20.0% by weight, based on the total weight of the solid content. If the content of the photopolymerization initiator is within the above-mentioned range, the polymerization reactivity is excellent and the film strength is secured, unlike the case of excessively high content which causes high polymerization rate and low film strength due to lowered molecular weight.

A sensitizer and a photostabilizer may be used in combination with the above-mentioned photopolymerization initiator.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzalacetone, p-(dimethylamino)phenyl styryl ketone, p-(dimethylamino)phenyl-p-methylstyryl ketone, benzophenone, p-(dimethylamino)benzophenone (or Michler's ketone), p-(diethylamino)benzophenone, benzoanthrone, benzothiazole type compounds described in JP-B No. 51-48516, TINUVIN 1130 and TINUVIN 400.

In addition to the above-exemplified compounds, it is also preferable to add a heat polymerization preventing agent. For example, examples of useful heat polymerization preventing agents include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and 2-mercaptobenzoimidazole.

—Photo Acid Generating Agent—

The photo acid generating agent is not particularly limited as long as it can be decomposed upon irradiation with active light or radiation to generate an acid and is capable of polymerizing a monomer having polymerizability (a polymerizable monomer). The photo acid generating agent may be a conventional photo acid generating agent.

Usable photo acid generating agent include onium salts such as diazonium salts described in S. I. Schlesinger, Photogr. Sci. Eng., 18, 387(1974) and T. S. Bal et al, Polymer, 21, 423(1980); ammonium salts described in U.S. Pat. Nos. 4,069,055 and 4069,056 and JP-A No. 3-140140; phosphonium salts described in D. C. Necker et al, Macromolecules, 17, 2468(1984), C. S. Wen et al, Teh. Proc. Conf. Rad. Curing ASIA, p 478 Tokyo, October (1988), U.S. Pat. Nos. 4,069,055 and 4,069,056; iodonium salts described in J. V. Crivello et al, Macromorecules, 10(6), 1307(1977), Chem. & Eng. News, November 28, p 31(1988), EU Patent No. 104,143, U.S. Pat. Nos. 339,049 and 410,201, JP-A Nos. 2-150848 and 2-296514; and sulfonium salts described in J. V Crivello et al, Polymer J. 1773(1985), J. V. Crivello et al, J. Org. Chem., 43, 3055(1978); W. R. Watt et al, J. Polymer Sci., Polymer Chem. Ed., 22, 1789(1984), J. V. Crivello et al, Polymer Bull., 14, 279 (1985), J. V. Crivello et al, Macromorecules, 14(5), 1141 (1981), J. V. Crivello et al, J. Polymer Sci., Polymer Chem. Ed., 17, 2877 (1979), EU Patent No. 370,693, U.S. Pat. No. 3,902,114, EU Patent Nos. 233,567, 297,443, 297,442, U.S. Pat. Nos. 4,933,377, 410,201, 339,049, 4,760,013, 4,734,444, 2,833,827, Germany Patent Nos. 2,904,626, 3,604,580, and 3,604,581; selenonium salts described in J. V Crivello et al, Macromorecules, 10(6), 1307(1977), J. V. Crivello et al, J. Polymer Sci., Polymer Chem. Ed., 17, 1047 (1979); and arsonium salts described in C. S. Wen et al, Teh. Proc. Conf. Rad. Curing ASIA, p 478 Tokyo, October (1988); organic halogen compounds described in U.S. Pat. No. 3,905,815, JP-B No. 46-4605, JP-A Nos. 48-36281, 55-32070, 60-239736, 61-169835, 61-169837, 62-58241, 62-212401, 63-70243, and 63-298339; organometal/organic halogen compounds described in K. Meier et al, J. Rad. Curing, 13(4), 26(1986), T. P. Gill et al, Inorg. Chem., 19, 3007(1980), D. Astruc. Acc. Chem. Res., 19(12), 377(1896), and JP-A No. 2-161445; o-nitrobenzyl type protection group-containing photo acid generating agents described in S. Hayase et al, J. Polymer Sci., 25, 753(1987), E. Reichmanis et al, J. Polymer Sci, Polymer Chem. Ed., 23, 1(1985), Q. Q. Zhu et al, J. Photochem., 36, 85 39, 317(1987), B. Amit et al, Tetrahedron Lett., (24), 2205(1973), D. H. R. Barton et al, J Chem. Soc., 3571(1965), P. M. Collins et al, J. Chem. Soc., Perkin I, 1695(1975), M. Rudinstein et al, Tetrahedron Lett., (17), 1445(1975), J. W. Walker et al, J. Am. Chem. Soc., 110,7170 (1988), S. C. Busman et al., J. Imaging Technol., 11(4), 191 (1985), H. M. Houlihan et al, Macromolecules, 21, 2001 (1988), P. M. Collins et al, J. Chem. Soc., Chem. Commun., 532(1972), S Hayase et al, Macromolecules, 18, 1799(1985), E. Reichmanis et al., J. Electrochem. Soc., Solid State Sci. Technol., 130(6), F. M. Houlihan et al, Macromolecules 21, 2001(1988), EU Patent Nos. 0,290,750, 046,083, 156,535, 271,851, 0388,343, U.S. Pat. Nos. 3,901,710, and 4,181,531, JP-A Nos. 60-198538 and 53-133022; compounds which are capable of generating sulfonic acid by photolysis such as iminosulfonates described in M. TUNOOKA et al, Polymer Preprints Japan, 35(8), G Bemer et al, J. Rad. Curing, 13(4), W. J. Mijs et at, Coating Technol., 55(697), 45(1983), Akzo, H. Adachi et at, Polymer preprints, Japan 37(3), EU Patent Nos. 0199,672, 84,515, 199,672, 044,115, and 0101,122, U.S. Pat. Nos. 4,618,564, 4,371,605, and 4,431,774, and JP-A Nos. 64-18143, 2-245756, and 4-365048; and disulfone compounds described in JP-A No. 61-166544.

In addition to the above-exemplified compounds, compounds represented by the following formula (IV) are also preferable.

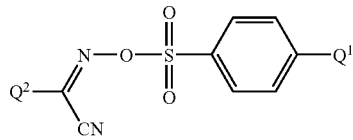

Formula (IV)

In the formula (IV), $Q^1$ represents a hydrogen atom or an alkyl group having 1 to 3 carbon atoms; $Q^2$ represents an unsusbstituted phenyl group, a phenyl group substituted by an alkyl group having 1 to 3 carbon atoms, or a phenyl group substituted by an alkoxy having 1 to 3 carbon atoms.

Examples of the alkyl group having 1 to 3 carbon atoms represented by $Q^1$ include methyl, ethyl, and propyl groups. The phenyl group substituted by an alkyl group having 1 to 3 carbon atoms represented by $Q^2$ may be an o-isopropylphenyl. The phenyl group substituted by an alkoxy having 1 to 3 carbon atoms represented by $Q^2$ may be a p-methoxyphenyl group, a p-ethoxyphenyl group, or a p-propoxyphenyl group.

The content of photo acid generating agent in the photosensitive composition is generally in a range of 0.001 to 40% by weight, preferably in a range of 0.01 to 20% by weight, and more preferably 0.1 to 15% by weight, based on the total weight of the composition (excluding solvent).

In view of sensitivity, the radiation sensitive compound in the invention is more preferably a photopolymerization initiator rather than a photo acid generating agent; a negative-type photosensitive composition can be obtained by using a photopolymerization initiator —Curing Agent—

The photosensitive composition according to the invention may contain at least one curing agent in accordance with the necessity. The curing agent is effective in promoting the curing of a pattern to be formed. Hereinafter, a radical polymerizable monomer and a crosslinking agent usable as curing agents will be described.

When the photosensitive composition according to the invention is a negative type photosensitive composition and a photopolymerization initiator is used as the radiation sensitive compound, at least one of the following radical polymerizable monomers is preferably selected and used as the curing agent. When the photo acid generating agent is used, at least one of the following crosslinking agents is preferably selected and used as the curing agent.

—Radical Polymerizable Monomer—

As the radical polymerizable monomer, a compound having at least one addition polymerizable ethylenic unsaturated group and having a boiling point of 100° C. or higher at normal pressure is preferable. The ethylenic unsaturated group is particularly preferably a (meth)acryloyl group. The term "(meth)acryloyl" means acryloyl or methacryloyl and similarly, the term "(meth)acrylate" means acrylate or methacrylate hereinafter.

Examples of the radical polymerizable monomer having a (meth)acryloyl group include mono-functional acrylates and methacrylates such as polyethylene glycol mono(meth)acrylate, polypropylene glycol mono(meth)acrylate, and phenoxyethyl(meth)acrylate; polyfunctional acrylates and methacrylates such as polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylol propane tri(acryloyloxypropyl)ether, tri(acryloyloxyethyl)isocyanurate, compounds obtained by adding ethylene oxide or propylene oxide to a polyfunctional alcohol such as glycerin or trimethylol ethane and successively (meth)acrylating the obtained addition compounds, urethane acrylates described in JP-B Nos. 48-41708 and 50-6034 and JP-A No. 51-37193, polyester acrylate compounds described in JP-A No. 48-64183, JP-B Nos. 49-43191 and 52-30490, and epoxy acrylates, which are reaction products of epoxy resins and (meth)acrylic acid; and mixtures thereof. Further, photosetting monomers and oligomers described in NIPPON SECHAKU KYOKAI-SHI (Journal of Japanese Adhesive Associate), Vol. 20, No. 7, p. 300-308 are also usable.

Among them, polyfunctional(meth)acryl compounds having two or more (meth)acryloyl groups are preferable, and polyfunctional(meth)acrylates are more preferable in terms of improvement in curability.

The content of radical polymerizable monomer in the photosensitive composition is preferably 1 to 45% by weight, more preferably 5 to 43% by weight, and still more preferably 10 to 40% by weight, based on the total weight of the solid content of the composition. If the content is within the above-mentioned range, a sufficient curing property and elution property of unexposed portions can be secured, thus avoiding insufficient curing property of exposed portions or considerable deterioration of the elution property of the unexposed portions.

—Crosslinking Agent—

Any crosslinking agent can be used without any limit as long as it can carry out film curing by crosslinking reaction and examples thereof include (a) an epoxy resin, (b) a melamine compound, a guanamine compound, a glycoluril compound, or an urea compound each of which is substituted by at least one group selected from a methylol group, an alkoxymethyl group, and an acyloxymethyl group, and (c) a phenol compound, a naphthol compound, or a hydroxyanthracene compound each of which is substituted by at least one group selected from a methylol group, an alkoxymethyl group, and an acyloxymethyl group. Among them, polyfunctional epoxy resins are preferable.

The epoxy resin described in item (a) is not particularly limited as long as it has epoxy groups and crosslinking property. Examples thereof include divalent glycidyl-containing low molecular weight compounds such as bisphenol A glycidyl ether, ethylene glycol diglycidyl ether, ethylene glycol diglycidyl ether, butanediol diglycidyl ether, hexanediol diglycidyl ether, dihydroxybiphenyl diglycidyl ether, phthalic acid diglycidyl ester, and N,N-diglycidyl aniline; trivalent glycidyl-containing low molecular weight compounds such as trimethylolpropane triglycidyl ether, trimethylol phenol triglycidyl ether, TrisPo-PA triglycidyl ether; tetravalent glycidyl-containing low molecular weight compounds such as pentaerythritol tetraglycidyl ether and tetramethylol bisphenol A tetraglycidyl ether; polyvalent glycidyl-containing low molecular weight compounds such as dipentaerythritol pentaglycidyl ether, dipentaerythritol hexaglycidyl ether; and glycidyl-containing high molecular weight compounds such as polyglycidyl(meth)acrylate and 1,2-epoxy-4-(2-oxirlanyl) cyclohexane adduct of 2,2-bis(hydroxymethyl)-1-butanol.

The number of methylol, alkoxymethyl, and acyloxymethyl groups contained as substituent groups in the crosslinking agent (b) is from 2 to 6 in the case of the melamine compounds, and is from 2 to 4 in the case of glycoluril compounds, guanamine compounds, and urea compounds; and is preferably from 5 to 6 in the case of the melamine compounds, and is preferably from 3 to 4 in the case of glycoluril compounds, guanamine compounds, and urea compounds.

Hereinafter, the melamine compounds, guanamine compounds and glycoluril compounds guanamine compounds described in the item (b) are occasionally referred to as "compounds of item (b)" (e.g., methylol-containing organic compounds of item (b), alkoxymethyl-containing compounds or item (b), or acyloxymethyl-containing compounds of item (b)).

The methylol-containing compounds of item (b) can be obtained by heating alkoxymethyl-containing compounds of item (b) in an alcohol in the presence of acid catalyst such as hydrochloric acid, sulfuric acid, nitric acid, or methanesulfonic acid. The acyloxymethyl-containing compound of item (b) can be obtained by mixing and stirring methylol-containing compounds of item (b) and acylchloride in the presence of basic catalyst.

Hereinafter, specific examples of the compounds of item (b) having the substituent groups are described.

Examples of the melamine compounds include hexamethylolmelamine, hexamethoxymethylmelamine, compounds obtained by methoxymethylating 1 to 5 methylol groups of hexamethylolmelamine and mixtures thereof, hexamethoxyethylmelamine, hexacyloxymethylmelamine, and compounds obtained by acyloxymethylating 1 to 5 methylol groups of hexamethylolmelamine and mixtures thereof.

Examples of the guanamine compounds include tetramethylolguanamine. tetramethoxymethylguanamine, compounds obtained by methoxymethylating 1 to 3 methylol groups of tetramethylolguanamine and mixtures thereof, tetramethoxyethylguanamine, tetraacyloxymethylguanamine, compounds obtained by acyloxymethylating 1 to 3 methylol groups of tetramethylolguanamine and mixtures thereof.

Examples of the glycoluril compounds include tetramethylol glycoluril, tetramethoxymethyl glycoluril, compounds obtained by methoxymethylating 1 to 3 methylol groups of tetramethylol glycoluril and mixtures thereof, and compounds obtained by acyloxymethylating 1 to 3 methylol groups of tetramethylol glycoluril and mixtures thereof.

Examples of the urea compounds include tetramethylolurea, tetramethoxymethylurea, compounds obtained by methoxymethylating 1 to 3 methylol groups of tetramethylolurea and mixtures thereof, and tetramethoxyethylurea.

Only one compound of item (b) may be used, or a plurality of compounds of item (b) may be used in combination.

The crosslinking agent (c), that is, a phenol compound, a naphthol compound, or a hydroxyanthracene compound each of which is substituted by at least one group selected from a methylol group, an alkoxymethyl group, and acyloxymethyl group, thermally crosslinks to suppress the intermixing with the overcoat photoresist, and increases the film strength similarly to the case of the above-mentioned crosslinking agent of item (b).

Hereinafter, these compounds as a whole are sometimes referred to as "compounds of item (c)" (e.g., methylol-containing compounds of item (c), alkoxymethyl-containing compounds of item (c), or acryloxymethyl-containing compounds of item (c)).

The number of the methylol groups, the acyloxymethyl groups, and the alkoxymethyl groups contained in the crosslinking agent (c) is at least 2. From a viewpoint of the thermal crosslinking property and the storage stability, phenol compounds whose second and fourth positions are all substituted by such groups are preferable. Also, naphthol compounds and hydroxyanthracene compounds as skeleton preferably have such substituents at all of the ortho- and para-positions relative to the OH group. The 3- and 5-positions of the phenol compounds as skeleton may be unsubstituted or substituted. Also, the positions other than the ortho-position relative to the OH group of the naphthol compounds may be unsubstituted or substituted.

The methylol-containing compound of item (c) can be obtained by reaction of formalin and a compound having hydrogen at the ortho- or para-(2- or 4-) position relative to a phenolic OH group in the presence of a basic catalyst such as sodium hydroxide, potassium hydroxide, ammonia, tetraalkylammonium hydroxide.

The alkoxymethyl-containing compound of item (c) can be obtained by heating a methylol-containing compound of item (c) in an alcohol in the presence of an acid catalyst such as hydrochloric acid, sulfuric acid, nitric acid, or methanesulfonic acid.

The acyloxymethyl-containing compound of item (c) can be obtained by reaction of a methylol-containing compound of item (c) with acyl chloride in the presence of a basic catalyst.

The skeleton compound for the crosslinking agent (c) may be a phenol, naphthol, or hydroxyanthracene compound whose ortho- or para-position relative to the phenolic OH group is unsubstituted. Examples of usable skelton compounds include respective isomers of phenol and cresol, 2,3-xylenol, 2,5-xylenol, 3,4-xylenol, 3,5-xylenol, bisphenols such as bisphenol A, 4,4'-bishydroxybiphenyl, TrisP-PA (manufactured by Honshu Kagaku Kogyo Co., Ltd.), naphthol, dihydroxynaphthalene, and 2,7-dihydroxyanthracene.

Specific examples of the crosslinking agent (c) include trimethylol phenol, tri(methoxymethyl)phenol, compounds obtained by methoxymethylating 1 or 2 methylol groups of trimethylol phenol, trimethylol-3-cresol, tri(methoxymethyl)-3-cresol, compounds obtained by methoxymethylating 1 or 2 methylol groups of trimethylol-3-cresol, dimethylol cresol such as 2,6-dimethylol-4-cresol, tetramethylol bisphenol A, tetramethoxymethylbisphenol A, compounds obtained by methoxymethylating 1 to 3 methylol groups of tetramethylol bisphenol A, tetramethylol-4,4'-bishydroxybiphenyl, tetramethoxymethyl-4,4'-bishydroxybiphenyl, TrisP-PA in form of hexamethylol, hexamethoxymethylated TrisP-PA, compounds obtained by methoxymethylating 1 to 5 methylol groups of hexamethylol body of TrisP-PA, and bishydroxymethylnaphthalenediol.

Further examples include hydroxyanthracene compounds such as 1,6-dihydroxymethyl-2,7-dihydroxyanthracene, and acyloxymethyl-containing compounds such as compounds obtained by acyloxymethylating some or all of the methylol groups of the above-mentioned methylol-containing compounds.

Preferable examples of those compounds include trimethylol phenol, bishydroxymethyl-p-cresol, tetramethylol bisphenol A, hexamethylol body of TrisP-PA (manufactured by Honshu Kagaku Kogyo Co., Ltd.), or phenol compounds obtained by substituting some or all of the methylol groups of these compounds with alkoxymethyl groups. Only one compound of item (c) may be used, or a plurality of compounds of item (c) may be used in combination.

Preferable compounds among the above-mentioned crosslinking agents are compounds of item (b) (a melamine compound, a guanamine compound, a glycoluryl compound, or an urea compound each of which is substituted by at least one group selected from a methylol group, an alkoxymethyl group, and an acyloxymethyl group) and a more preferable compound is a melamine compound which is substituted by at least one group selected from a methylol group, an alkoxymethyl group, and an acyloxymethyl group.

When the photosensitive composition according to the invention contains the crosslinking agent, the content of the above-mentioned crosslinking agents (a) to (c) in the photosensitive composition is preferably 1 to 40% by weight and more preferably 10 to 30% by the total weight of the solid content (weight) of the composition, although it varies depending on the materials. If the content is within the range, a sufficient curing property and elution property of unexposed portions can surely be attained, thus avoiding insufficient curing property of exposed portions or considerable deterioration of the elution property of the unexposed portions.

—Alkali-Soluble Resin—

The photosensitive composition according to the invention may preferably contain at least one alkali-soluble resin (hereinafter, also referred to as a binder according to the invention) in accordance with the necessity. The binder according to the invention is not particularly limited and is preferably selected in consideration of heat resistance, developability, and availability.

The alkali-soluble binder is preferably a linear organic high molecular weight polymer soluble in an organic solvent and developable with an aqueous weakly alkaline solution. It is particularly preferable when photopolymerization initiator is used as the after-mentioned radiation sensitive compound.

Usable examples of such a linear organic high molecular weight polymer include polymers having carboxylic acid on the side chains such as methacrylic acid copolymers, acrylic acid copolymers, itaconic acid copolymers, crotonic acid copolymers, maleic acid copolymers, partially esterified maleic acid copolymers described in JP-A No. 59-44615, JP-B Nos. 54-34327, 58-12577, 54-25957, JP-A Nos. 59-53836 and 59-71048, and particularly preferable examples include acidic cellulose derivatives having carboxylic acid on the side chains. In addition, those obtained by adding acid anhydrides to polymers having hydroxyl groups, polyhydroxystyrene type resins, polysiloxane type resins, poly(2-hydroxyethyl(meth)acrylate), polyvinylpyrrolidone, polyethylene oxide, and polyvinyl alcohol are also useful.

Further, monomers having hydrophilic groups may be included as copolymerization components, and examples of such monomers include alkoxyalkyl(meth)acrylate, hydroxyalkyl(meth)acrylate, glycerol(meth)acrylate, (meth)acrylamide, N-methylolacrylamide, secondary and tertiary alkylacrylamide, dialkylaminoalkyl (meth)acrylate, morpholino(meth)acrylate, N-vinylpyrrolidone, N-vinylcaprolactam, vinylimidazole, vinyltriazole, methyl(meth)acrylate, ethyl(meth)acrylate, branched or straight chain propyl(meth)acrylate, branched or straight chain butyl(meth)acrylate, and phenoxyhydroxypropyl(meth)acrylate.

Besides the above-exemplified monomers, a monomer containing a tetrahydrofurfuryl group, phosphoric acid residue, a phosphoric acid ester residue, a quaternary ammonium residue, an ethylene oxide chain, a propylene oxide chain, a residue of sulfonic acid or a salt of sulfuric acid, a morpholinylethyl group, or the like are also usable.

In the case of negative type using the above-mentioned photopolymerization initiator as the radiation sensitive compound, polymers having polymerizable groups on the side chains and polymers having an allyl, (meth)acryl, or an allyloxyalkyl group on the side chains are also preferable in view of improvement in crosslinking efficiency.

Hereinafter, examples of the polymers having those polymerizable groups will be described; however the polymers are not limited to these examples as long as they have a carbon-carbon unsaturated bond and an alkali-soluble group such as a COOH group, an OH group, or an ammonium group.

The polymer having a polymerizable group may be, for example, a compound obtained by allowing a copolymer of a OH-containing monomer (e.g. 2-hydroxyethyl acrylate), a COOH-containing monomer (e.g. methacrylic acid), and another monomer copolymerizable therewith such as an acrylic or vinyl type monomer to react with a compound (e.g. glycidyl acrylate) having a carbon-carbon unsaturated bond group and an epoxy ring having reactivity with an OH group.

Beside the epoxy ring, acid anhydrides and compounds having an isocyanate or acryloyl group are also usable as compounds having reactivity with a OH group. Also, reaction products obtained by carrying out reaction of compounds having an epoxy ring as described in JP-A Nos. 6-102669 and 6-1938 and unsaturated carboxylic acids such as acrylic acid and further carrying out reaction of the obtained compounds with saturated or unsaturated polybasic acid anhydrides are also usable.

Examples of compounds having an alkali-soluble group (such as a COOH group) and a carbon-carbon unsaturated group include DIANAL NR series (manufactured by Mitsubishi Rayon Co., Ltd.); PHOTOMER 6173 (COOH-containing Polyurethane acrylic oligomer, manufactured by Diamond Shamrock Co., Ltd.); VISCOAT R-264, KS RESIST 106 (both manufactured by Osaka Organic Chemical Industry Co., Ltd.); CYCLOMER P series and PLACCEL CF 200 series (both manufactured by Daicel Chem., Ind., Ltd.); and EBECRYL 3800 (manufactured by Daicel UCB Co., Ltd.).

Among the above-mentioned various alkali-soluble resins, acrylic resins are preferable, and preferable examples thereof include copolymers of monomers selected from benzyl (meth)acrylate, (meth)acrylic acid, hydroxyethyl(meth)acrylate, and (meth)acrylamide and KS RESIST 106 (manufactured by Osaka Organic Chemical Industry Co., Ltd.) and CYCLOMER P series (manufactured by Daicel Chem., Ind., Ltd.).

The alkali-soluble resins preferably have a weight average molecular weight (the polystyrene equivalent value measured by GPC method) of 1000 to $2\times10^5$, more preferably 2000 to $1\times10^5$, and still more preferably 5000 to $5\times10^4$.

The content of alkali-soluble resin in the photosensitive composition is preferably 0.0 to 25.0% by weight, more preferably 0.0 to 15.0% by weight, and still more preferably 0.0 to 10.0% by weight, based on the total weight of the solid content of the composition.

When a photo acid generating agent is used as the above-mentioned radiation sensitive compound, examples of usable alkali-soluble resins include various alkali-soluble polymer compounds such as phenol-formaldehyde resin, cresol-formaldehyde resin, phenol-cresol-formaldehyde co-condensation resin, phenol-modified xylene resin, polyhydroxystyrene, polyhalogenated hydroxystyrene, copolymers of N-(4-hydroxyphenyl)methacrylamide, copolymers of hydroquinone monomethacrylate, sulfonylimide type polymers described in JP-A No. 7-28244, carboxyl-containing polymers described in JP-A No. 7-36184, novolak resins, phenolic hydroxyl-containing acrylic resins described in JP-A Nos. 51-34711, sulfonamide-containing acrylic resins described in JP-A No. 2-866, and urethane type resins.

Among them, novolak resins are especially preferable, and novolak resins of p-cresol, novolak resins of p-cresol and m-cresol, and novolak resins represented by the following formula (V) (n represents a numeral value realizing a molecular weight in the range of 5,000 to 10,000) are preferably used.

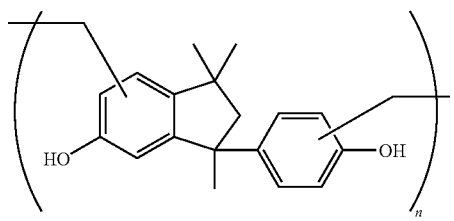

Formula (V)

The content of alkali-soluble resin in the photosensitive composition when a photo acid generating agent is used is preferably 0.0 to 30.0% by weight, more preferably 5.0 to 25.0% by weight, and still more preferably 10.0 to 20.0% by weight, based on the total weight of the solid content in the composition.

When the photosensitive composition according to the invention is of positive type, resins whose alkali-soluble groups are protected with acid-decomposable groups are also usable in addition to the above-mentioned alkali-soluble resins exemplified for the case of the photo acid generating agents. The resins may be a compound having a —C—O—C— bond or a C—O—Si— bond, and the following examples can be cited.

(a) polymerizable compounds including at least one moiety selected from orthocarboxylic acid esters and carboxylic acid amide acetals, the moiety being a crosslinking component contained in the main chain or the moiety being a lateral substituent group;

(b) oligomeric or polymeric compounds including a moiety selected from repeating acetals and ketals contained in the main chain;

(c) compounds including at least one enol ester or N-acylaminocarbonate;

(d) β-ketoesters or cyclic acetals or ketals of β-ketoamides;

(e) compounds containing silyl ethers;

(f) compounds containing silyl enol ethers;

(g) monoacetals or monoketals whose aldehyde or ketone components have a solubility of 0.1 to 100 g/L in developer;

(h) tertiary alcohol type ethers; and (i) carboxylic acid esters and carbonic acid esters of alcohols whose hydroxyl group is at a tertiary allyl position or a benzyl position.

The above-mentioned compounds (a) that can be cleaved by acid are described in Germany Patent Nos. 2,610,842 and 2,928,636. Mixtures containing the compounds (b) are described in Germany Patent Nos. 2,306,248 and 2,718,254. The above-mentioned compounds (c) are described in EU Patent Application Publication Nos. 0,006,626 and 0,006,627. The above-mentioned compounds (d) are described in EU Patent Application Publication No. 0,202,196 and the compounds usable as the above-mentioned (e) are described in Germany Patent Nos. 3,544,165 and 3,601,264. The above-mentioned compounds (f) are described in Germany Patent Nos. 3,730,785 and 3,730,783 and the compounds (g) are described in Germany Patent No. 3,730,783. The above-mentioned compounds (h) are described in U.S. Pat. No. 4,603,101 and the above-mentioned compounds (i) are described in U.S. Pat. No. 4,491,628 and Report by J. M. Frechet et al, J. Imaging Sci. 30, 59-64(1986).

The content of these compounds protected with the acid-decomposable groups is generally 1 to 60% by weight, preferably 5 to 50% by weight, based on the total weight of the solid content of the photosensitive composition.

—Solvent—

At the time of producing a photosensitive composition according to the invention, solvent may generally be contained. The solvent is basically not limited as long as it is satisfactory in the solubility of the respective components and coatability of the obtained photosensitive composition, and is preferably selected in consideration of solubility, coatability, and safety of the binder.

Specific examples of the solvent include esters such as ethyl acetate, n-butyl acetate, isobutyl acetate, amyl formate, isoamyl acetate, isobutyl acetate, butyl propionate, isopropyl butyrate, ethyl butyrate, and butyl butyrate, alkylesters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate; 3-oxypropionic acid alkyl esters such as methyl 3-oxypropionate and ethyl 3-oxypropionate (e.g., methyl 3-methoxypropionate, ethyl 3-methoxypropionate, methyl 3-ethoxypropionate, and ethyl 3-ethoxypropionate); 2-oxypropionic acid alkyl esters such as methyl 2-oxypropionate, ethyl 2-oxypropionate, propyl 2-oxypropionate (e.g., methyl 2-methoxypropionate, ethyl 2-methoxypropionate, propyl 2-methoxypropionic acid, methyl 2-ethoxypropionate, ethyl 2-ethoxypropionate, methyl 2-methoxy-2-methylpropionate, and ethyl 2-oxy-2-methylpropionate, methyl 2-methoxy-2-methylpropionate, and ethyl 2-ethoxy-2-methylpropionate); methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones such as methyl ethyl ketone, cyclohexanone, 2-heptane, and 3-heptane; and aromatic hydrocarbons such as toluene and xylene.

Preferable examples among them include methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate. Still more preferable examples are ethyl lactate, cyclohexanone, and propylene glycol methyl ether acetate.

—Various Additives—

The photosensitive composition according to the invention may contain various additives in accordance with the necessity, such as a filler, a polymer compound other than the above-mentioned polymers, a surfactant, an adhesion promoting agent, an antioxidant, an ultraviolet absorbent, a flocculation preventing agent, and the like.

Specific examples of the above-mentioned various additives include fillers such as glass and alumina; polymer compounds other than above-mentioned polymers, such as polyvinyl alcohol, polyacrylic acid, polyethylene glycol monoalkyl ether, and polyfluoroalkyl acrylate; surfactants such as nonionic, cationic, and anionic surfactants; adhesion promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysialne, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-tert-butylphenol) and 2,6-di-tertbutylphenol; ultraviolet absorbents such as 2-(3-tert-butyl-5-methyl-2-hydroxyphenyl)-5-chlorobenztriazole and alkoxybenzophenone; and flocculation preventing agents such as poly(sodium acrylate).

To promote the alkali-dissolution of uncured portions and thereby further improve the developability of the photosensitive composition according to the invention, an organic carboxylic acid, preferably a low molecular weight organic carboxylic acid with a molecular weight of 1000 or lower, may be added to the composition.

Specific examples thereof include aliphatic monocarboxylic acids such as formic acid, acetic acid, propionic acid, butyric acid, valeric acid, pivalic acid, caproic acid, diethylacetic acid, enanthic acid, and caprylic acid; aliphatic dicarboxylic acids such as oxalic acid, malonic acid, succinic acid, glutaric acid, adipic acid, pimellic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylic acid; aliphatic polycarboxylic acids such as phthalic acid, isophthalic acid, terephthalic acid, trimellitic acid, trimesic acid, mellophanic acid, and pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamilydeneacetic acid, cumaric acid, and umbellic acid.

The photosensitive composition according to the invention can be used preferably for forming colored pixels (such as color filters) for liquid crystal display devices and solid-state imaging devices (e.g. CCD and CMOS) and also for producing inks for printing, inks for ink-jet printing, and coating materials.

—Color Filter and Its Production Method—

Next, a color filter according to the invention will be described in detail along with its production method.

In the production method of the color filter according to the invention, the above-mentioned photosensitive composition according to the invention is used. The color filter according to the invention is produced most preferably using the photosensitive composition according to the invention, by a method comprising: applying the photosensitive composition to a support by a coating method such as rotary coating, spread coating, or roll coating to form a radiation sensitive composition layer; exposing the layer through a predetermined mask pattern; and developing the exposed pattern with a developer to form a colored pattern (image formation). The image formation may optionally be accompanied by a curing step of curing the formed colored pattern by heat and/or exposure to light, in accordance with the necessity. The light or radiation to be used therefor is preferably ultraviolet radiation such as g-ray, h-ray, and i-ray.

The image formation step (and optionally, the curing step) is repeated in accordance with the number of desired hues, thereby producing a color filter with the desired number of hues.

The support may be soda glass, PYREX™ glass, and quartz glass for a liquid crystal device or the like, and supports obtained by attaching transparent conductive films to these glass materials; a photoelectric conversion device substrate for an imaging device, such as a silicon substrate, a complementary metal oxide semiconductor (CMOS). In an embodiment, these supports have black stripes that isolate the respective pixels.

Further, if necessary, an undercoating layer may be provided on the support so as to improve the adhesion to the upper layer, so as to prevent diffusion of substances, or so as to level the substrate surface.

The developer to be used in the production method of the color filter according to the invention may be any developer as long as it is capable of dissolving uncured portions of the photosensitive composition according to the invention while not dissolving cured portions. Specifically, the developer may be selected from combinations of organic solvents, and aqueous alkaline solutions. Examples of the organic solvents include the above-described solvents that are usable in the production of the photosensitive composition according to the invention.

The above-mentioned aqueous alkaline solutions are preferably aqueous alkaline solutions containing an alkaline compound, for example, sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene dissolved in a concentration in a range of 0.001 to 10% by weight, preferably in a range of 0.01 to 1% by weight. When a developer containing such an aqueous alkaline solution is used, washing with water is generally carried out after development.

The color filter according to the invention can be used for liquid crystal display devices and solid-state imaging devices such as CCD, and is particularly suitable for a high-resolution CCD devices and CMOS devices, such as having 1,000,000 or more pixels. The color filter according to the invention can be used as a color filter to be installed between a light receiving part of the respective pixels of the CCD and micro-lens for focusing light.

Some exemplary embodiments of the invention are described below.

<1> A photosensitive composition containing at least an organic-solvent-soluble dye, wherein the solid content of the organic-solvent-soluble dye is 50% by weight or higher based on the total weight of the solid content of the photosensitive composition, and the organic-solvent-soluble dye comprises at least one di- or higher-valent metal salt of azo dye.

<2> The photosensitive composition according to <1>, wherein the solid content of the di- or higher-valent metal salt of an azo dye is 20% by weight or higher based on the total weight of the organic-solvent-soluble dye.

<3> The photosensitive composition according to <1>, wherein the solid content of the di- or higher-valent metal salt of an azo dye is 30% by weight or higher based on the total weight of the organic-solvent-soluble dye.

<4> The photosensitive composition according to any one of <1> to <3>, wherein the di- or higher-valent metal salt of an azo dye is a metal salt of a compound selected from a γ-acid-azo compound, a pyrazolone azo compound, and a pyridone azo compound.

<5> The photosensitive composition according to any one of <1> to <4>, wherein the di- or higher-valent metal salt of an azo dye is a metal salt of a pyridone azo compound.

<6> The photosensitive composition according to one of <1> to <5>, wherein the di- or higher-valent metal salt of an azo dye is an azo dye metal salt represented by the following formula (I).

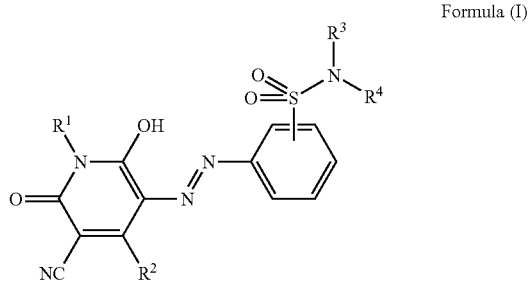

Formula (I)

wherein in formula (I), $R^1$, $R^3$ and $R^4$ each independently represent a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms, or a heteroatom-containing substituent group; at least one of $R^1$, $R^3$, or $R^4$ contains at least one of —$SO_3M$ or COOM (M represents a cation of di- or higher-valent metal atom) as a substituent group; $R^3$ and $R^4$ may form a heterocycle in combination with a nitrogen atom bonded thereto; and $R^2$ represents an alkyl group having 1 to 10 carbon atoms, a methoxymethyl group, or a trifluoromethyl group.

<7> The photosensitive composition according to any one of <1> to <6>, further containing an organic-solvent-soluble dye represented by the formula (II).

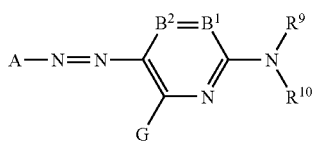

Formula (II)

wherein in formula (II), A represents an aryl group or a 5 to 6-membered aromatic heterocyclic group; $B^1$ represents —$CR^5$= or a nitrogen atom; $B^2$ represents —$CR^6$= or a nitrogen atom; $B^1$ and $B^2$ do not represent nitrogen atoms simultaneously; $R^9$ and $R^{10}$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group; $R^9$ and $R^{10}$ are not hydrogen atoms simultaneously; G, $R^5$, and $R^6$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclyloxy group, an alkoxycarbonyloxy group, an aryloxycarbonyloxy group, an amino group substituted by an alkyl, aryl, or heterocyclic group, an acylamino group, a ureido group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a sulfo group, a mercapto group, or a heterocyclylthio group; $R^5$ and $R^9$ may be bonded to each other to form a 5- or 6-membered ring; and $R^9$ and $R^{10}$ may be bonded to each other to form a 5- or 6-membered ring.

<8> The photosensitive composition according to any one of <1> to <7>, further containing a photopolymerization initiator.

<9> The photosensitive composition according to <8>, wherein the photopolymerization initiator is an oxime compound.

<10> The photosensitive composition according to any one of <1> to <7> further containing a photo acid generating agent, wherein the photosensitive composition is a negative photosensitive composition.

<11> The photosensitive composition according to one of <1> to <7> further containing a photo acid generating agent, wherein the photosensitive composition is a positive photosensitive composition.

<12> A color filter containing at least an organic-solvent-soluble dye, wherein the solid content of the organic-solvent-soluble dye is 50% by weight or higher based on the total weight of the solid content in a unit volume, and the organic-solvent-soluble dye comprises a di- or higher-valent metal salt of an azo dye. Preferably, the color filter comprises the photosensitive composition according to any one of <1> to <11>.

<13> A color filter production method including applying the photosensitive composition according to any one of <1> to <11> to a support, exposing the composition through a mask, and forming a patterned image by developing the exposed composition.

In the color filter production method, when a color filter with desired hues is produced, the above-mentioned steps are repeated in accordance with the number of desired hues. Further, in accordance with the necessity, a step of curing the patterned image by heat and/or exposure to light may preferably be carried out.

EXAMPLES

The present invention will be described more specifically by reference to Examples. The scope of the invention is not limited to the Examples as long as the spirit of the invention is retained. In the Examples, the term "part" refers to part by weight unless otherwise specified.

Example 1

1) Preparation of Resist Solution

| | |
|---|---|
| Propylene glycol monomethyl ether acetate (PGMEA): | 19.20 parts, |
| Ethyl lactate: | 36.67 parts, |
| Binder [a 41% EL solution of benzyl methacrylate/methacrylic acid/2-hydroxyethyl methacrylate copolymer (copolymerization ratio (by mole) = 60/20/20)]: | 30.51 parts, |
| Dipentaerythritol hexaacrylate (polymerizable compound): | 12.20 parts, |
| Polymerization inhibitor (p-methoxyphenol): | 0.0061 part, |
| Fluorine-containing surfactant (F-475, manufactured by Dainippon Ink and Chemicals, Inc.): | 0.83 part |
| TAZ-107 (trihalomethyltriazine-based photopolymerization initiator; manufactured by Midori Kagaku Co., Ltd.): | 0.586 part |

The above-listed components were mixed and dissolved to obtain a resist solution.

2) Production of Glass Substrate with Undercoating

After a glass substrate (CORNING 1737) was washed with an aqueous 1% NaOH solution by ultrasonic wave application, the substrate was washed with water and baked for dehydration (200° C. for 30 minutes). Next, the resist solution obtained in 1) was applied with a spin coater to the washed glass substrate to form a 2 μm-thick film and heated and dried at 220° C. for 1 hour to form a cured film (an undercoating layer).

3) Preparation of Colored Curable Composition (Negative Type) A-1

The compounds with the following composition were mixed and dissolved to form a colored curable composition A-1.

[Composition of the Colored Curable Composition A-1]

| | |
|---|---|
| Cyclohexanone: | 80 part, |
| Organic-solvent-soluble dye A (exemplary compound (M1) described above): | 4.8 part, |
| Organic-solvent-soluble dye B (exemplary compound (3) described above): | 7.2 part, |
| The compound 2 shown below: | 5.9 part, |
| Photopolymerization initiator CGI-242 (manufactured by Ciba Speciality Chemicals Inc.): | 2.1 part, |

Compound 2

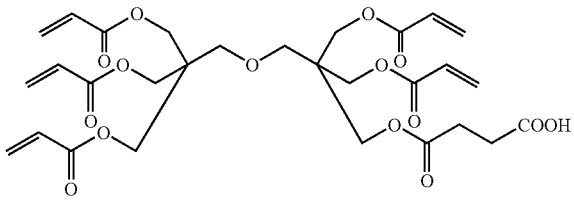

4) Exposure/Development (Image Formation) of the Colored Curable Composition

The colored curable composition A-1 obtained in 3) was applied with a spin coater onto the undercoating layer of the glass substrate having the undercoating layer obtained in 2) to form a 0.8 μm-thick film on the undercoating layer, and the film was pre-baked at 100° C. for 120 seconds.

Next, the coated film was exposed to light having a wavelength of 365 nm at an exposure of 2000 mJ/cm$^2$ by using an exposure apparatus. After exposure, the film was developed with a 60% CD-2000 developer (manufactured by Fuji Film Electronics Materials, Inc.) in conditions of 23° C. for 120 seconds. Thereafter, the film was rinsed with flowing water for 10 seconds and dried by spray drying. Then, post-baking was carried out at 200° C. for 45 minutes to obtain a coated film.

Examples 2 to 11 and Comparative Example 1

Colored curable compositions (A-2) to (A-12) were obtained and films were formed in the same manner as in Example 1, except that the two organic-solvent-soluble dyes A and B used in the preparation of the colored curable composition A-1 were changed as shown in the following Table 1.

(Evaluation)

The films obtained in the respective Examples and Comparative Example were subjected to evaluation of the color omission resistance described below. The results are shown in Table 1.

The absorbance (absorbance A) of each film after post-baking was measured at a wavelength of 435 nm. Then, the film was immersed in cyclohexane for 30 seconds and the absorbance (absorbance B) of the film was measured again at a wavelength of 435 nm. The dye remaining ratio (%; B/A× 100) was calculated from the obtained absorbance A and absorbance B. As the value is closer to 100%, the resistance is better.

TABLE 1

| | Composition | Organic solvent-soluble dye A | Organic solvent-soluble dye B | Ratio (dye A/dye B) | Color omission resistance |
|---|---|---|---|---|---|
| Example 1 | A-1 | Exemplary compound (M1) | Exemplary compound (3) | 4/6 | 100% |
| Example 2 | A-2 | Exemplary compound (M1) | Exemplary compound (17) | 3/7 | 100% |
| Example 3 | A-3 | Exemplary compound (M2) | Exemplary compound (22) | 4/6 | 100% |
| Example 4 | A-4 | Exemplary compound (M3) | Exemplary compound (23) | 4/6 | 98% |
| Example 5 | A-5 | Exemplary compound (M4) | Exemplary compound (24) | 4/6 | 98% |
| Example 6 | A-6 | Exemplary compound (M5) | Na salt of Acid Red 42 | 4/6 | 96% |
| Example 7 | A-7 | Exemplary compound (M6) | Na salt of Acid Red 57 | 3/7 | 94% |
| Example 8 | A-8 | Exemplary compound (M7) | Na salt of Acid Red 42 | 2/8 | 92% |
| Example 9 | A-9 | Sr salt of Acid Yellow 29 | Exemplary compound (22) | 4/6 | 94% |
| Example 10 | A-10 | Mg salt of Acid Red 42 | Na salt of Acid Yellow 42 | 6/4 | 92% |
| Example 11 | A-11 | Ca salt of Acid Yellow 65 | Na salt of Acid Red 42 | 4/6 | 91% |

TABLE 1-continued

| | Composition | Organic solvent-soluble dye A | Organic solvent-soluble dye B | Ratio (dye A/dye B) | Color omission resistance |
|---|---|---|---|---|---|
| Comparative Example 1 | A-12 | The following compound 1 | Na salt of Acid Red 42 | 4/6 | 45% |

Compound (1)

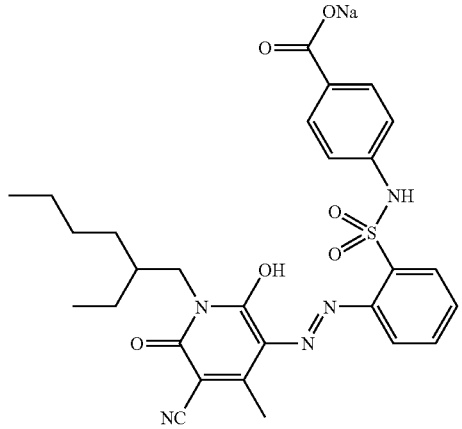

As shown in Table 1, although the dye concentration was high in Examples, the color omission due to elution of the dye at overcoating was suppressed, and films with desired color density and hue were obtained. In contrast, in Comparative Example 1, the color omission was remarkable at the time of overcoating.

Example 12

A film was formed in the same manner and the color omission resistance evaluation was carried out in the same manner as in Example 1, except that the colored photosensitive composition A-1 was changed to the colored photosensitive composition B-1 produced as follows and heating was carried out at 120° C. for 60 seconds after radiation but before development. The results are shown in Table 2 below.

The compounds shown in the following composition were mixed and dissolved to produce the colored curable composition B-1 according to the invention.

[Composition of Colored Curable Composition B-1]

| | |
|---|---|
| Cyclohexanone: | 80 parts |
| Binder [p-cresol novolak resin (Mw = 5000)]: | 6.0 parts |
| Organic-solvent-soluble dye A (exemplary compound (M1) described above): | 4.4 parts |
| Organic-solvent-soluble dye B (exemplary compound (22) described above): | 6.6 parts |
| Hexamethoxymethylmelamine: | 2.5 parts |
| Photo acid generating agent PAG-1 shown below: | 0.5 part |

PAG-1

Examples 13 to 16 and Comparative Example 2

Colored curable compositions (B-2) to (B-6) were obtained and films were formed in the same manner as Example 12, except that the two organic-solvent-soluble dyes A and B used in the production of the colored curable composition B-1 in Example 12 were changed as shown in Table 2 below. The obtained films were subjected to the color omission resistance evaluation. The results are shown in Table 2.

TABLE 2

| | Composition | Organic solvent-soluble dye A | Organic solvent-soluble dye B | Ratio (dye A/dye B) | Color omission resistance |
|---|---|---|---|---|---|
| Example 12 | B-1 | Exemplary compound (M1) | Exemplary compound (22) | 4/6 | 95% |
| Example 13 | B-2 | Exemplary compound (M3) | Exemplary compound (24) | 4/6 | 93% |
| Example 14 | B-3 | Exemplary compound (M5) | Na salt of Acid Red 57 | 4/6 | 92% |
| Example 15 | B-4 | Exemplary compound (M6) | Na salt of Acid Red 42 | 3/7 | 91% |

TABLE 2-continued

| | Composition | Organic solvent-soluble dye A | Organic solvent-soluble dye B | Ratio (dye A/dye B) | Color omission resistance |
|---|---|---|---|---|---|
| Example 16 | B-5 | Sr salt of Acid Yellow 29 | Exemplary compound (23) | 4/6 | 90% |
| Comparative Example 2 | B-6 | Compound 1 shown above | Na salt of Acid Red 65 | 4/6 | 40% |

As shown in Table 2, although the dye concentration was high in Examples, the color omission due to elution of the dye at overcoating was suppressed, and films with desired color density and hue were obtained. In contrast, in Comparative Example 2, the color omission was remarkable at the time of overcoating.

Example 17

A colored curable composition C-1 was produced by mixing and dissolving the compounds of the following composition.

[Composition of Colored Curable Composition C-1]

| | |
|---|---|
| Cyclohexanone: | 80 parts |
| Binder P-1 shown below: | 8.0 parts |
| Organic-solvent-soluble dye A (exemplary compound (M1) described above): | 4.4 parts |
| Organic-solvent-soluble dye B (exemplary compound (22) described above): | 6.6 parts |
| Photo acid generating agent PAG-2 shown below: | 0.5 part |
| Trioctylamine: | 0.5 part |

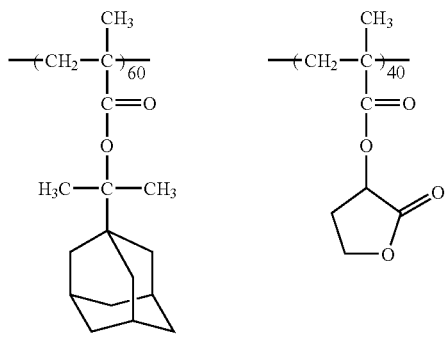

P-1

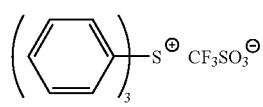

PAG-2

The obtained colored curable composition C-1 was applied with a spin coater to the undercoating layer of the glass substrate having the undercoating layer which was prepared in the same manner as in Example 1 thereby forming a 0.8 μm-thick film on the undercoating layer, and was pre-baked at 100° C. for 120 seconds. Thereafter, the entire surface of the formed film was exposed to light having a wavelength of 248 nm at an exposure of 2000 mJ/cm$^2$ by using an exposure apparatus. After exposure, the film was heated to 120° C. for 60 seconds and developed with a 60% CD-2000 developer (manufactured by Fuji Film Electronics Materials, Inc.) in conditions of 23° C. for 120 seconds. After that, the film was rinsed with flowing water for 10 seconds to obtain a coated film. The color omission resistance was evaluated in the same manner as in Example 1. The results are shown in Table 3.

Examples 18 and 19 and Comparative Example 3

Colored curable compositions (C-2) to (C-4) were obtained and films were formed in the same manner as in Example 17, except that the two organic-solvent-soluble dyes A and B used in the production of the colored curable composition C-1 in Example 17 were changed as shown in Table 3 below. The obtained films were subjected to the color omission resistance evaluation. The results are shown in Table 3.

TABLE 3

| | Composition | Organic solvent-soluble dye A | Organic solvent-soluble dye B | Ratio (dye A/dye B) | Color omission resistance |
|---|---|---|---|---|---|
| Example 17 | C-1 | Exemplary compound (M1) | Exemplary compound (22) | 4/6 | 95% |
| Example 18 | C-2 | Exemplary compound (M3) | Exemplary compound (23) | 4/6 | 94% |
| Example 19 | C-3 | Exemplary compound (M4) | Na salt of Acid Red 57 | 4/6 | 91% |
| Comparative Example 3 | C-4 | Compound 1 shown above | Na salt of Acid Red 65 | 4/6 | 40% |

As shown in Table 3, although the dye concentration was high in Examples, the color omission due to elution of the dye at overcoating was suppressed, and films with desired color density and hue were obtained. In contrast, in Comparative Example 3, the color omission was remarkable at the time of overcoating.

Color omission due to dye elution can be suppressed and films having desired color densities and hues can be obtained not only when the azo dye metal salts according to the invention used in the respective Examples and the combinations of the azo dye metal salts and the organic-solvent-soluble dyes represented by the formulas (II) or (III) are used, but also when other azo dye metal salts according to the invention and other combinations according to the invention are used. This is because the above-mentioned effects can be accomplished also in such cases.

Accordingly, the invention provides a photosensitive composition that can form a cured material in which dye elution is suppressed at the time of overcoating, and provides a color filter in which dye elution from previously formed pattern is suppressed at the time of overcoating when patterns of a plurality of colors are formed and which has desired hues and suppressed color omission, and also provides a production method of the color filter.

All publications, patent applications, and technical standards mentioned in this specification are herein incorporated by reference to the same extent as if each individual publication, patent application, or technical standard was specifically and individually indicated to be incorporated by reference.

What is claimed is:

1. A photosensitive composition comprising at least an organic-solvent-soluble dye,
   wherein the solid content of the organic-solvent-soluble dye is 50% by weight or higher based on the total weight of the solid content of the photosensitive composition, and wherein the organic-solvent-soluble dye comprises at least one di- or higher-valent metal salt of an azo dye,
   wherein the photosensitive composition further comprises an organic-solvent-soluble dye represented by the following formula (II):

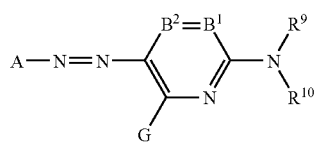

Formula (II)

wherein in formula (II), A represents an aryl group or a 5 to 6-membered aromatic heterocyclic group; $B^1$ represents —$CR^5$= or a nitrogen atom; $B^2$ represents —$CR^6$= or a nitrogen atom; $B^1$ and $B^2$ do not represent nitrogen atoms simultaneously; $R^9$ and $R^{10}$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group; $R^9$ and $R^{10}$ are not hydrogen atoms simultaneously; G, $R^5$, and $R^6$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl; group, an acyl group, a hydroxy group, an alkoxy group, an aryloxy group, a silyloxy group, an acyloxy group, a carbamoyloxy group, a heterocyclyloxy group, an alkoxycarbonyloxy group, an aryloxycarbonyloxy group, an amino group substituted by an alkyl, aryl, or heterocyclic group, an acylamino group, a ureido group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a sulfo group, a mercapto group, or a heterocyclylthio group; $R^5$ and $R^9$ may be bonded to each other to form a 5- or 6-membered ring; and $R^9$ and $R^{10}$ may be bonded to each other to form a 5- or 6-membered ring, and wherein the composition further comprises a photopolymerization initiator or a photo-acid generator.

2. The photosensitive composition according to claim 1, wherein the solid content of the di- or higher-valent metal salt of an azo dye is 20% by weight or higher based on the total weight of the organic-solvent-soluble dye.

3. The photosensitive composition according to claim 1, wherein the solid content of the di- or higher-valent metal salt of an azo dye is 30% by weight or higher based on the total weight of the organic-solvent-soluble dye.

4. The photosensitive composition according to claim 1, wherein the di- or higher-valent metal salt of an azo dye is a metal salt of a compound selected from a γ-acid-azo compound, a pyrazolone azo compound, and a pyridone azo compound.

5. The photosensitive composition according to claim 1, wherein the di- or higher-valent metal salt of an azo dye is a metal salt of a pyridone azo compound.

6. The photosensitive composition according to claim 1, wherein the di- or higher-valent metal salt of an azo dye is an azo dye metal salt represented by the following formula (I):

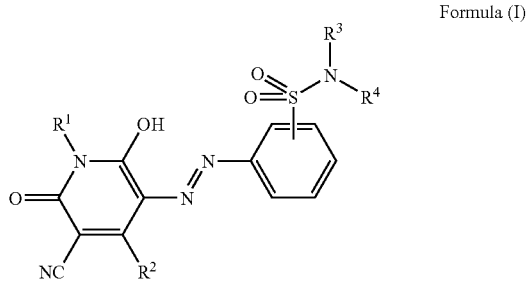

Formula (I)

wherein in formula (I), $R^1$, $R^3$ and $R^4$ each independently represent a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms, or a heteroatom-containing substituent group; at least one of $R^1$, $R^3$, or $R^4$ contains at least one of —$SO_3M$ or COOM (M represents a cation of di- or higher-valent metal atom) as a substituent group; $R^3$ and $R^4$ may form a heterocycle in combination with a nitrogen atom bonded thereto; and $R^2$ represents an alkyl group having 1 to 10 carbon atoms, a methoxymethyl group, or a trifluoromethyl group.

7. The photosensitive composition according to claim 1, wherein the photopolymerization initiator is an oxime compound.

8. The photosensitive composition according to claim 1, wherein the photosensitive composition is a negative photosensitive composition.

9. The photosensitive composition according to claim 1, wherein the photosensitive composition is a positive photosensitive composition.

10. A color filter production method comprising applying the photosensitive composition of claim 1 to a support, exposing the composition through a mask, and forming a patterned image by developing the exposed composition.

11. A color filter comprising at least an organic-solvent-soluble dye, wherein the solid content of the organic-solvent-soluble dye is 50% by weight or higher based on the total weight of the solid content in a unit volume, and the organic-solvent-soluble dye comprises a di- or higher-valent metal salt of an azo dye, and wherein the color filter further comprises an organic-solvent-soluble dye represented by the following formula (II):

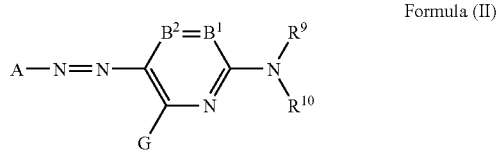

Formula (II)

wherein in formula (II), A represents an aryl group or a 5 to 6-membered aromatic heterocyclic group; $B^1$ represents —$CR^5$= or a nitrogen atom; $B^2$ represents —$CR^6$= or a nitrogen atom; $B^1$ and $B^2$ do not represent nitrogen atoms simultaneously; $R^9$ and $R^{10}$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group; $R^9$ and $R^{10}$ are not hydrogen atoms simultaneously; G, $R^5$, and $R^6$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclyloxy group, an alkoxycarbonyloxy group, an aryloxycarbonyloxy group, an amino group substituted by an alkyl, aryl, or heterocyclic group, an acylamino group, a ureido group, a sulfamoylamino group, an alkoxycarbonylamino group, an aryloxycarbonylamino group, an alkylsulfonylamino group, an arylsulfonylamino group, a nitro group, an alkylthio group, an arylthio group, an alkylsulfonyl group, an arylsulfonyl group, an alkylsulfinyl group, an arylsulfinyl group, a sulfamoyl group, a sulfo group, a mercapto group, or a heterocyclylthio group; $R^5$ and $R^9$ may be bonded to each other to form a 5- or 6-membered ring; and $R^9$ and $R^{10}$ may be bonded to each other to form a 5- or 6-membered ring.

* * * * *